United States Patent
Schoch et al.

(10) Patent No.: US 7,672,340 B2
(45) Date of Patent: Mar. 2, 2010

(54) BUILT-IN-SELF TEST FOR HIGH-SPEED SERIAL BIT STREAM MULTIPLEXING AND DEMULTIPLEXING CHIP SET

(75) Inventors: Daniel Schoch, Costa Mesa, CA (US); Ichiro Fujimori, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1267 days.

(21) Appl. No.: 10/349,560

(22) Filed: Jan. 23, 2003

(65) Prior Publication Data
US 2004/0028065 A1 Feb. 12, 2004

Related U.S. Application Data

(60) Provisional application No. 60/401,734, filed on Aug. 6, 2002.

(51) Int. Cl.
*H04J 3/04* (2006.01)
(52) U.S. Cl. .................................. 370/535; 370/247
(58) Field of Classification Search ............... 370/535, 370/351, 212, 247, 506, 539; 714/725, 738
See application file for complete search history.

(56) References Cited

U.S. PATENT DOCUMENTS

| | | | | |
|---|---|---|---|---|
| 3,676,859 | A * | 7/1972 | Hollaway et al. | 714/708 |
| 3,987,248 | A * | 10/1976 | Platet et al. | 370/506 |
| 5,465,300 | A * | 11/1995 | Altschuler et al. | 380/30 |
| 6,704,890 | B1 * | 3/2004 | Carotti et al. | 714/700 |
| 6,725,408 | B1 * | 4/2004 | Cao et al. | 714/738 |
| 6,801,548 | B1 * | 10/2004 | Duschatko et al. | 370/537 |
| 6,874,107 | B2 * | 3/2005 | Lesea | 714/725 |
| 2002/0094025 | A1 * | 7/2002 | Hanamura et al. | 375/240.01 |
| 2003/0002474 | A1 * | 1/2003 | Alexander et al. | 370/351 |
| 2003/0217215 | A1 * | 11/2003 | Taborek et al. | 710/305 |

OTHER PUBLICATIONS

Suckow, Basics of High-Performance SerDes Design: Part I, Fairchild Semiconductor International, Sorth Portland, ME. p. 3 fig. 2 showing differential media between serializer and deserializer. http://www.analogzone.com/iot_0414.pdf as accessed on Feb. 22, 2007.*

* cited by examiner

*Primary Examiner*—Kwang B. Yao
*Assistant Examiner*—Andrew Lai
(74) *Attorney, Agent, or Firm*—Garlick Harrison & Markison; Bruce E. Garlick; Kevin L. Smith

(57) ABSTRACT

A bit stream multiplexer includes an input ordering block, a plurality of multiplexers, an output ordering block, and a Pseudo Random Bit Stream (PRBS) function. The input ordering block is operates to receive a first plurality of transmit bit streams at a first bit rate, order the first plurality of transmit bit streams based upon a first order select signal, and produce a first plurality of ordered transmit bit streams at the first bit rate. The input ordering block may also deskew the first plurality of transmit bit streams. The plurality of multiplexers operate to receive the first plurality of ordered transmit bit streams at the first bit rate and produce an interface plurality of transmit bit streams at an interface bit rate. The output ordering block operates to order the interface plurality of transmit bit streams based upon an interface order select signal. The PRBS function produces a PRBS that is coupled to at least one of the interface plurality of transmit bit streams. A bit stream demultiplexer is similarly constructed.

28 Claims, 22 Drawing Sheets

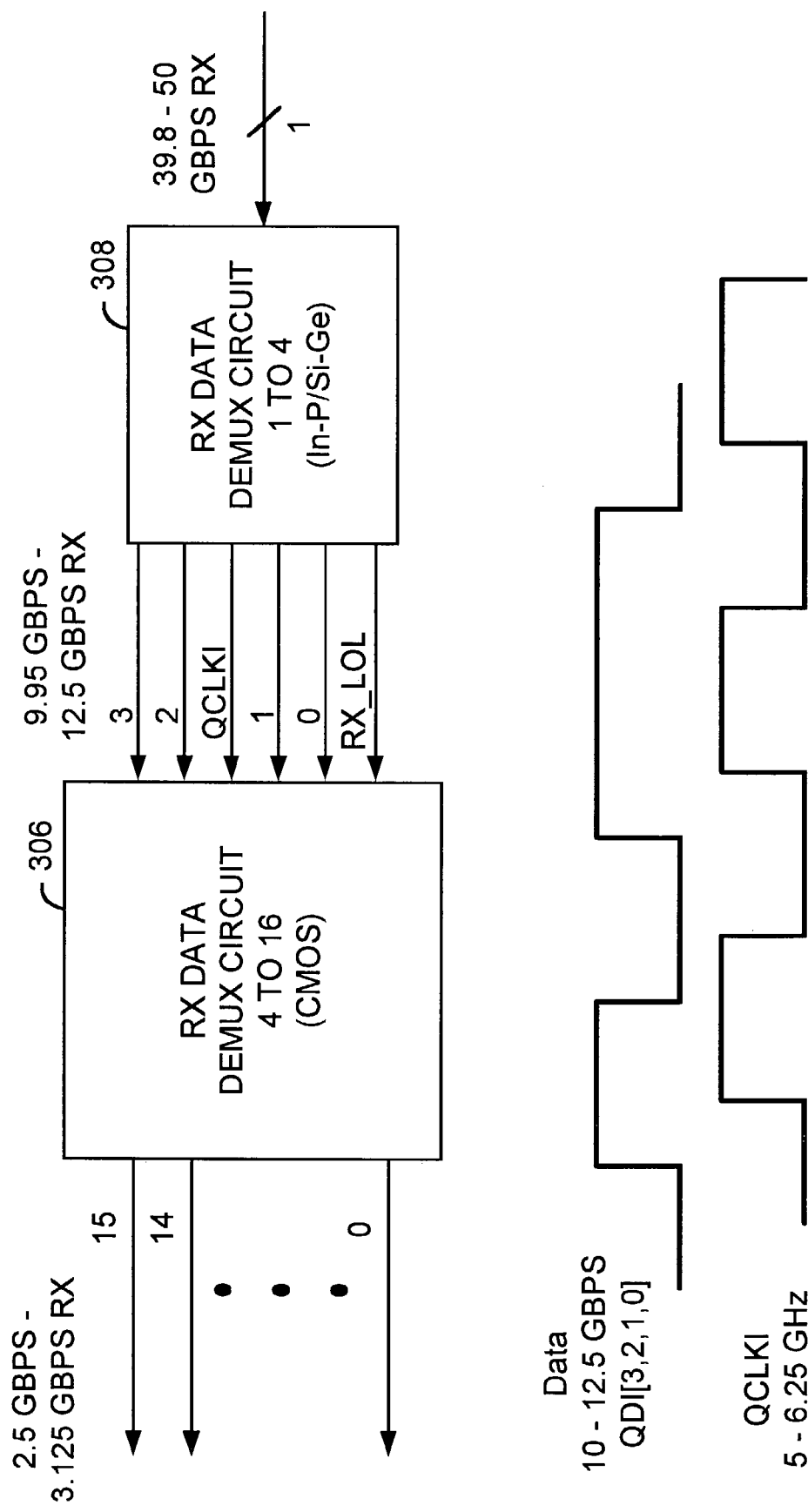

Transmitter Output and Clock Specifications

| Parameter | Symbol | Conditions | Min | Typ | Max | Units |
|---|---|---|---|---|---|---|
| Output Common Mode | Vcm | See Figure Below | 1760 | 1675 | 1790 | mV |
| Single Ended Output Impedance | $Z_{SE}$ | | 40 | 50 | 60 | Ω |
| Differential Output Impedance | $Z_d$ | | 80 | 100 | 120 | Ω |
| Output Impedance Match | $Z_M$ | | | | 10 | % |
| Q40, CML output Amplitude, Differential, p-p | Δ VQDO | See Figure Below | 410 | 500 | 590 | mV |
| Q40, Output Rise and Fall time (20% to 80%) | $t_{RH}$, $t_{FH}$ | | | 25 | 35 | ps |
| Differential output return loss * | S22 | Up to 7.5 GHz | 10 | | | dB |
| Single Ended output return loss | S22 | Up to 7.5 GHz | 6 | | | dB |

* 4-by-1 de-mux Output Return Loss >15 dB at 7.5 GHz.

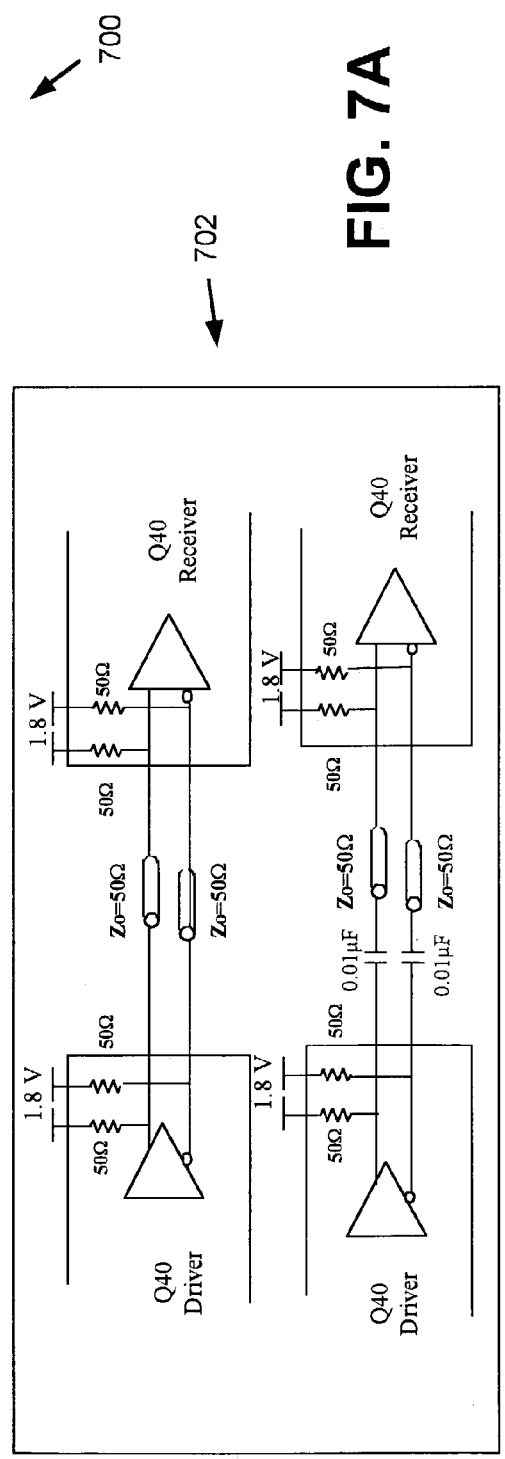

FIG. 7A

Receiver Input and Source Centered Clock Performance

| Parameter | Symbol | Conditions | Min | Typ | Max | Units |
|---|---|---|---|---|---|---|
| Output Common Mode | Vcm | See Figure Below | 1575 | 1675 | 1775 | mV |
| Single Ended Output Impedance | $Z_{SE}$ | | 40 | 50 | 60 | Ω |
| Differential Input impedance | $Z_d$ | | 80 | 100 | 120 | Ω |
| Input Impedance Mismatch | $Z_M$ | | | | 10 | % |
| Q40, CML Input Differential Amplitude, p-p | Δ VQDO | See Figure Below | 400 | 500 | 600 | mV |
| Q40 Input Rise and Fall Time (20% to 80%) | $t_{RH}, t_{FH}$ | | | 25 | 35 | ps |
| Differential output return loss* | S11 | Up to 7.5 GHz | 10 | | | dB |

*4-by-1 mux input return loss >15 db at 10 GHz

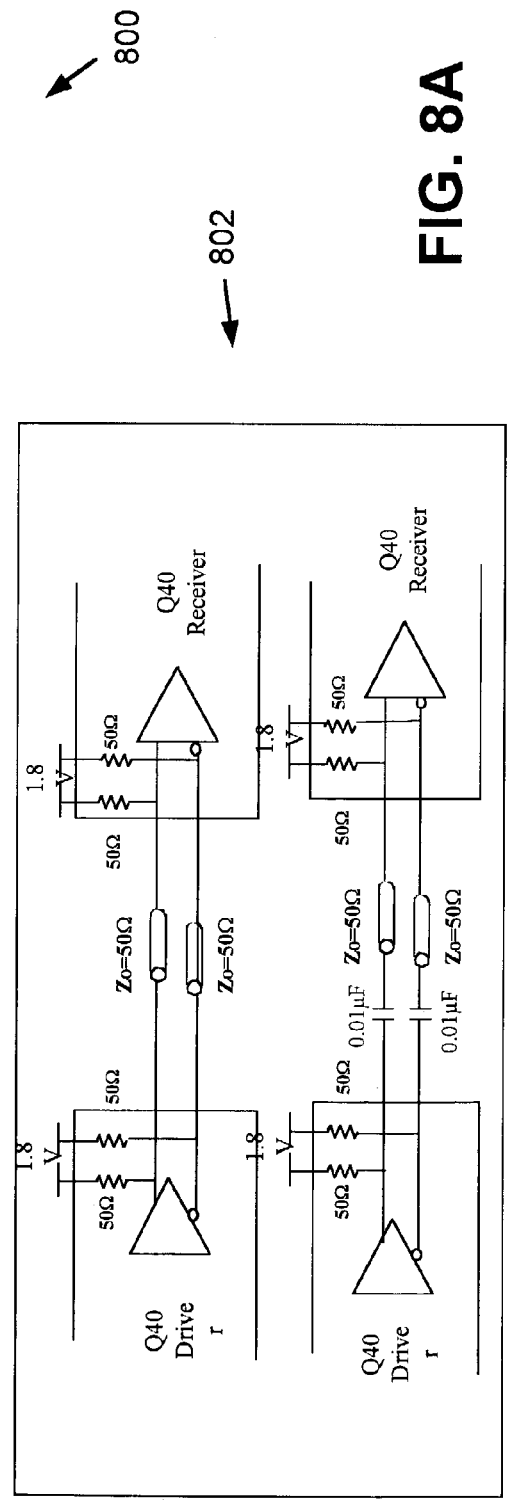

FIG. 8A

BUILT-IN-SELF TEST FOR HIGH-SPEED SERIAL BIT STREAM MULTIPLEXING AND DEMULTIPLEXING CHIP SET

CROSS REFERENCE TO RELATED APPLICATION

This application claims priority to U.S. Provisional Application Ser. No. 60/401,734, filed Aug. 6, 2002, which is incorporated herein by reference in its entirety for all purposes.

BACKGROUND OF THE INVENTION

1. Technical Field of the Invention

The present invention relates generally to communication systems; and more particularly to high-speed serial bit stream communications.

2. Description of Related Art

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs. This structure is not unique to the Internet, however. Portions of the PSTN, wireless cellular network infrastructure, Wide Area Networks (WANs), and other communication systems also employ this same structure.

The switch hubs employ switches to route incoming traffic and outgoing traffic. A typical switch located at a switch hub includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs located in the same geographic area or to other PCBs located at another geographic area.

For example, a switch that services a building in a large city couples via fiber media to switches mounted in other buildings within the city and switches located in other cities and even in other countries. Typically, Application Specific Integrated Circuits (ASICs) mounted upon the PCBs of the housing. These ASICs perform switching operations for the data that is received on the coupled media and transmitted on the coupled media. The coupled media typically terminates in a receptacle and transceiving circuitry coupled thereto performs signal conversion operations. In most installations, the media, e.g., optical media, operates in a simplex fashion. In such case, one optical media carries incoming data (RX data) to the PCB while another optical media carries outgoing data (TX data) from the PCB. Thus, the transceiving circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information from the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiving circuit that resides between the physical media and the ASIC must satisfy all of these requirements.

Various standardized interfaces have been employed to couple the transceiving circuit to the ASIC. These standardized interfaces include the XAUI interface, the Xenpak interface, the GBIC interface, the XGMII interface, and the SFI-5 interface, among others. The SFI-5 interface, for example, includes 16 data lines, each of which supports a serial bit stream having a nominal bit rate of 2.5 Giga bits-per-second (GBPS). Line interfaces also have their own operational characteristics. Particular high-speed line interfaces are the OC-768 interface and the SEL-768 interface. Each of these interfaces provides a high-speed serial interface operating at a nominal bit rate of 40 GBPS.

Particular difficulties arise in converting data between the 40×1 GBPS line interface and the 16×12.5 GBPS communication ASIC interface. In particular, operation on the 40 GBPS side requires the ability to switch data at a very high bit rate, e.g., exceeding the bit rate possible with a CMOS integrated circuit formed of Silicon. While other materials, e.g., Indium-Phosphate and Silicon-Germanium provide higher switching rates than do Silicon based devices, they are very expensive and difficult to manufacture. Further, the functional requirements of interfacing the 40×1 GBPS line interface and the 16×12.5 GBPS communication ASIC interface are substantial. Thus, even if a device were manufactured that could perform such interfacing operations, the effective yield in an Indium-Phosphate or Silicon-Germanium process would be very low.

Thus, there is a need in the art for low cost and high speed interface that couples a high-speed line side interface to a communication ASIC.

BRIEF SUMMARY OF THE INVENTION

In order to overcome the above-described shortcomings of the prior devices, among other shortcomings, a multiple bit stream interface interfaces a first transmit data multiplexing integrated circuit and a second transmit data multiplexing integrated circuit. The multiple bit stream interface includes an interface plurality of transmit bit streams each of which carries a respective bit stream at an interface bit rate. The interface further includes an interface clock operating at a frequency corresponding to one-half of the interface bit rate.

The first transmit data multiplexing integrated circuit receives a first plurality of transmit bit streams from a communication ASIC at a first bit rate and produces the interface plurality of transmit bit streams in a natural data order. The second transmit data multiplexing integrated circuit receives the interface plurality of transmit bit streams in the natural data order and produces a single bit stream output at a line bit rate in a bit order. The first transmit data multiplexing integrated circuit may reorder the first plurality of transmit bit streams to produce a plurality of reordered bit streams, and multiplex the plurality of reordered bit streams to produce the interface plurality of bit streams in the natural data order.

In one embodiment, the first plurality of transmit bit streams includes sixteen bit streams and the interface plurality of transmit bit streams includes four bit streams. In one operation, the first bit rate may is nominally 2.5 Giga Bits per Second (GBPS), the interface bit rate is be nominally 10 GBPS, and the line bit rate is nominally 40 GBPS. The second transmit data multiplexing integrated circuit may produce the single bit stream to a communicatively coupled fiber optic media.

According to the present invention, the bit stream multiplexer includes an input ordering block, a plurality of multiplexers, an output ordering block, and a Pseudo Random Bit Stream (PRBS) function. The input ordering block is operates to receive a first plurality of transmit bit streams at a first bit rate, order the first plurality of transmit bit streams based upon a first order select signal, and produce a first plurality of ordered transmit bit streams at the first bit rate. The input ordering block may also deskew the first plurality of transmit bit streams. The plurality of multiplexers operate to receive the first plurality of ordered transmit bit streams at the first bit rate and produce an interface plurality of transmit bit streams at an interface bit rate. The output ordering block operates to order the interface plurality of transmit bit streams based upon an interface order select signal. The PRBS function produces a PRBS that is coupled to at least one of the interface plurality of transmit bit streams.

In one embodiment, the plurality of multiplexers couple to the output of the output ordering block. In another embodiment, the plurality of multiplexers couple to the input of the output ordering block. The PRBS function may produce the PRBS on a plurality of the interface plurality of bit streams at one time or produce the PRBS on one line at a time and cover each of the interface plurality of transmit bit streams over time. The bit stream multiplexer may also include a skew adding circuit that adds skew to at least one of the interface plurality of transmit bit streams. The PRBS function may reside in the output ordering block, in the input ordering block, or in both the output ordering block and the input ordering block.

According to the present invention, the bit stream demultiplexer may include a plurality of demultiplexers, an input ordering block, an output ordering block, and a PRBS function. The plurality of demultiplexers receive an interface plurality of receive bit streams at an interface bit rate and demultiplex the interface plurality of bit streams to produce a first plurality of receive bit streams at a first bit rate. The input ordering block orders the first plurality of receive bit streams at the first bit rate based upon an interface order select signal. The input ordering block may also deskew the first plurality of transmit bit streams. The output ordering block receives the first plurality of receive bit streams at the first bit rate and orders the first plurality of receive bit streams based upon a first order select signal. The PRBS function produces a PRBS that is coupled to at least one of the first plurality of receive bit streams.

In one embodiment, the plurality of multiplexers provides input to the input ordering block. In another embodiment, the input ordering block provides input to the plurality of multiplexers. The bit stream demultiplexer may also include a skew adding circuit that adds skew to the PRBS that is coupled to at least one of the first plurality of receive bit streams. In one embodiment, the PRBS function resides in the output ordering block. In another embodiment, the PRBS function resides in the input ordering block.

A method for testing the functionality of a transmit multiplexing integrated circuit and a receive demultiplexing integrated circuit first includes coupling the receive demultiplexing integrated circuit and the transmit multiplexing integrated circuit into a circuit tester. The method then includes coupling a plurality of output lines of the receive demultiplexing integrated circuit to a plurality of input lines of the transmit multiplexing integrated circuit. Further, the method includes generating a Pseudo Random Bit Stream (PRBS) within the receive demultiplexing integrated circuit. Next, the method includes coupling the PRBS to at least one output line of the receive demultiplexing integrated circuit. The PRBS is then received on at least one input line of the transmit multiplexing integrated circuit. The transmit multiplexing integrated circuit then determines whether the PRBS is correctly received by the transmit multiplexing integrated circuit. When the PRBS is correctly received by the transmit multiplexing integrated circuit, a pass indication is provided to the circuit tester. When the PRBS is incorrectly received by the transmit multiplexing integrated circuit, a fail indication is provided to the circuit tester.

During testing, skew may be added to the PRBS generated in the receive demultiplexing integrated circuit. In such case, the PRBS is incorrectly received by the transmit multiplexing integrated circuit when the transmit multiplexing integrated circuit fails to remove the skew from the PRBS. The PRBS may be coupled over time on each of the plurality of (sixteen in one embodiment) lines coupling the integrated circuits. In some operations, the plurality of input lines of the transmit multiplexing integrated circuit are altered to carry the PRBS. The lines may be differential and the signals may be controlled to test the differential operation of the lines.

A similar method is employed to test the interface plurality of lines received by the receive demultiplexing integrated circuit and the transmit multiplexing integrated circuit. This method includes coupling the transmit multiplexing integrated circuit and the receive demultiplexing integrated circuit into a circuit tester, coupling a plurality of output lines of the transmit multiplexing integrated circuit to a plurality of input lines of the receive demultiplexing integrated circuit, generating a PRBS within the transmit multiplexing integrated circuit, coupling the PRBS to at least one output line of the transmit multiplexing integrated circuit, receiving the PRBS on at least one input line of the receive demultiplexing integrated circuit, and determining whether the PRBS is correctly received by the receive demultiplexing integrated circuit. When the PRBS is correctly received by the receive demultiplexing integrated circuit, providing a pass indication to the circuit tester. Further, when the PRBS is incorrectly received by the receive demultiplexing integrated circuit, providing a fail indication to the circuit tester.

Other features and advantages of the present invention will become apparent from the following detailed description of the invention made with reference to the accompanying drawings.

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

FIG. 6 is a block diagram illustrating the RX data demultiplexing integrated circuits of FIG. 3 and the interfaces serviced thereby;

FIG. 7A includes a table and a diagram that illustrate operating specifications for the TX interface between the TX data multiplexing integrated circuits of FIG. 3;

FIG. 8A includes a table and a diagram that illustrate operating specifications for the RX interface between the RX data demultiplexing integrated circuits of FIG. 3;

FIG. 11A is a block diagram illustrating a second embodiment of the first TX data multiplexing integrated circuit of FIG. 7A with particular detail relating to BIST structures contained therein;

10

Figure 12A:
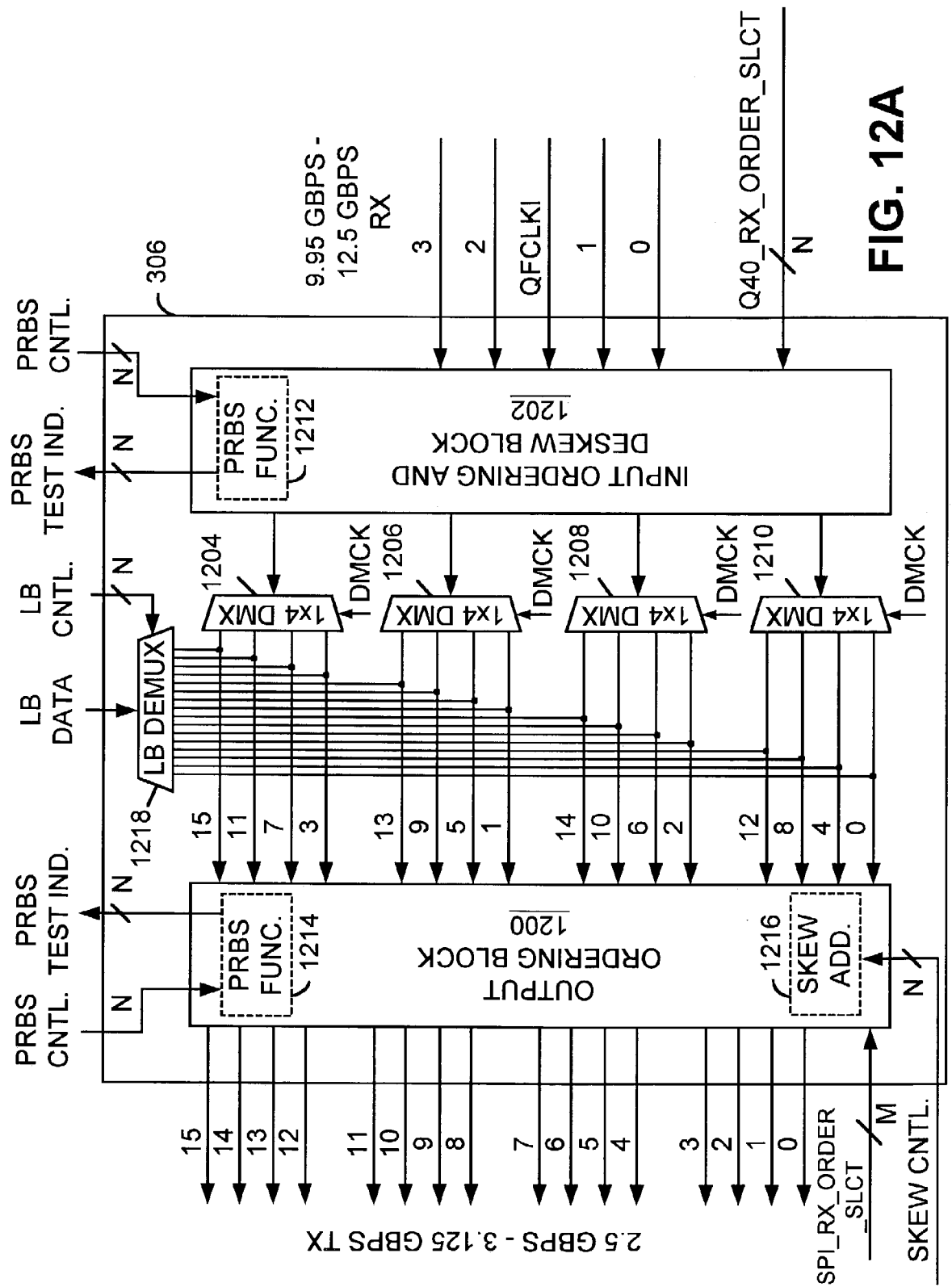
FIG. 12A is a block diagram illustrating a first embodiment of the first RX data demultiplexing integrated circuit of FIG. 8A with particular detail relating to BIST structures contained therein.
Figure 12B:
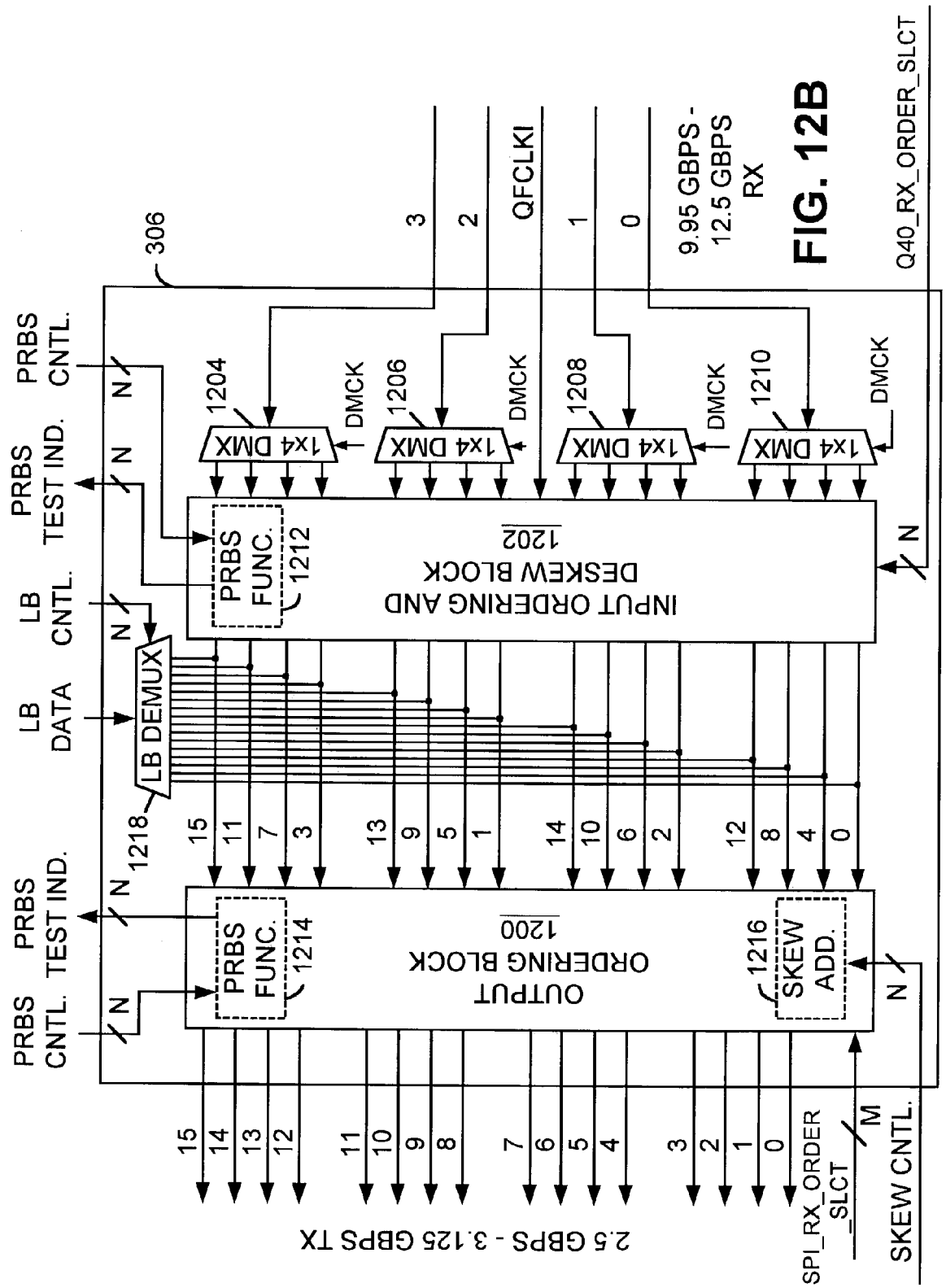
Figure 13:
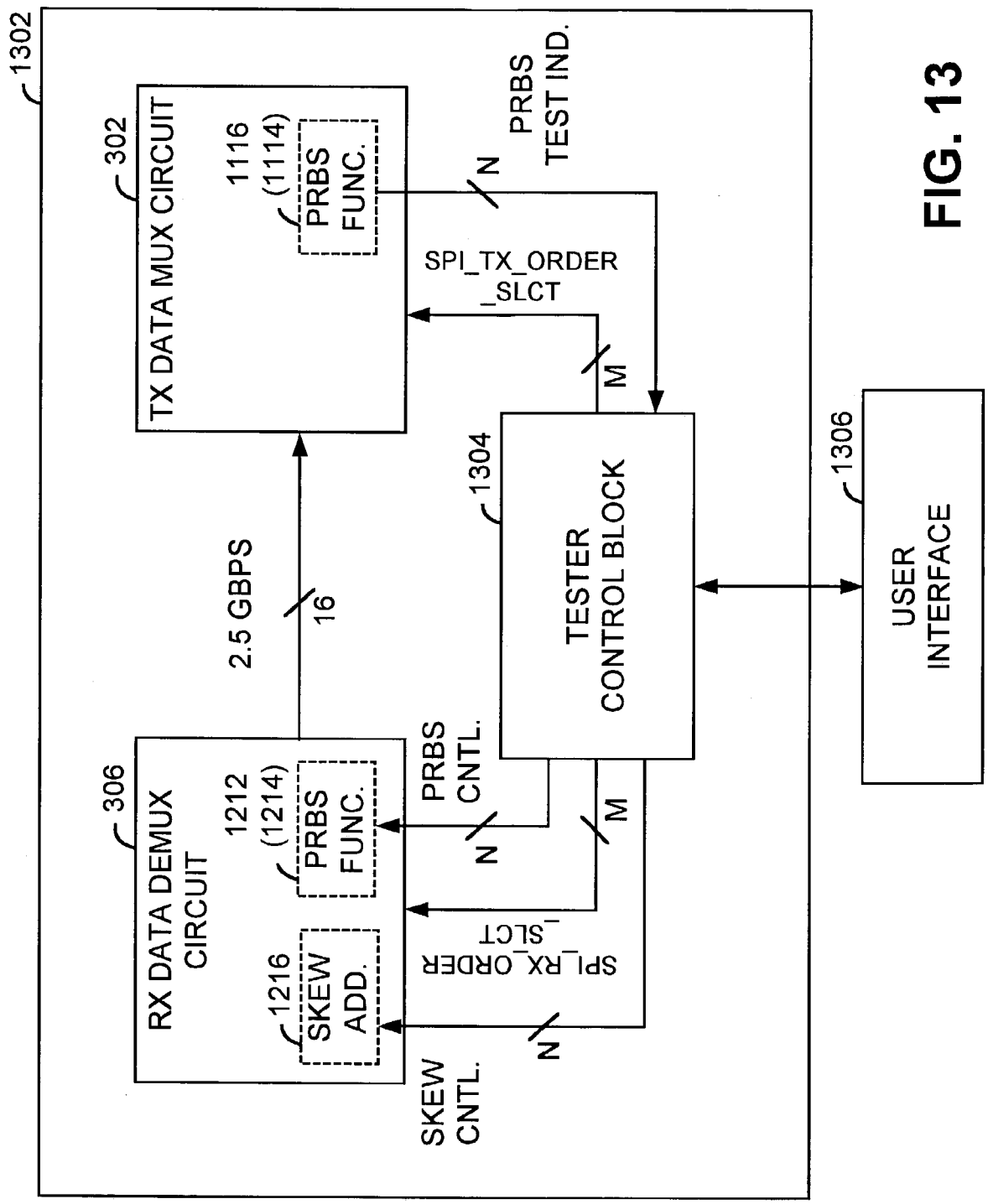
Figure 14:
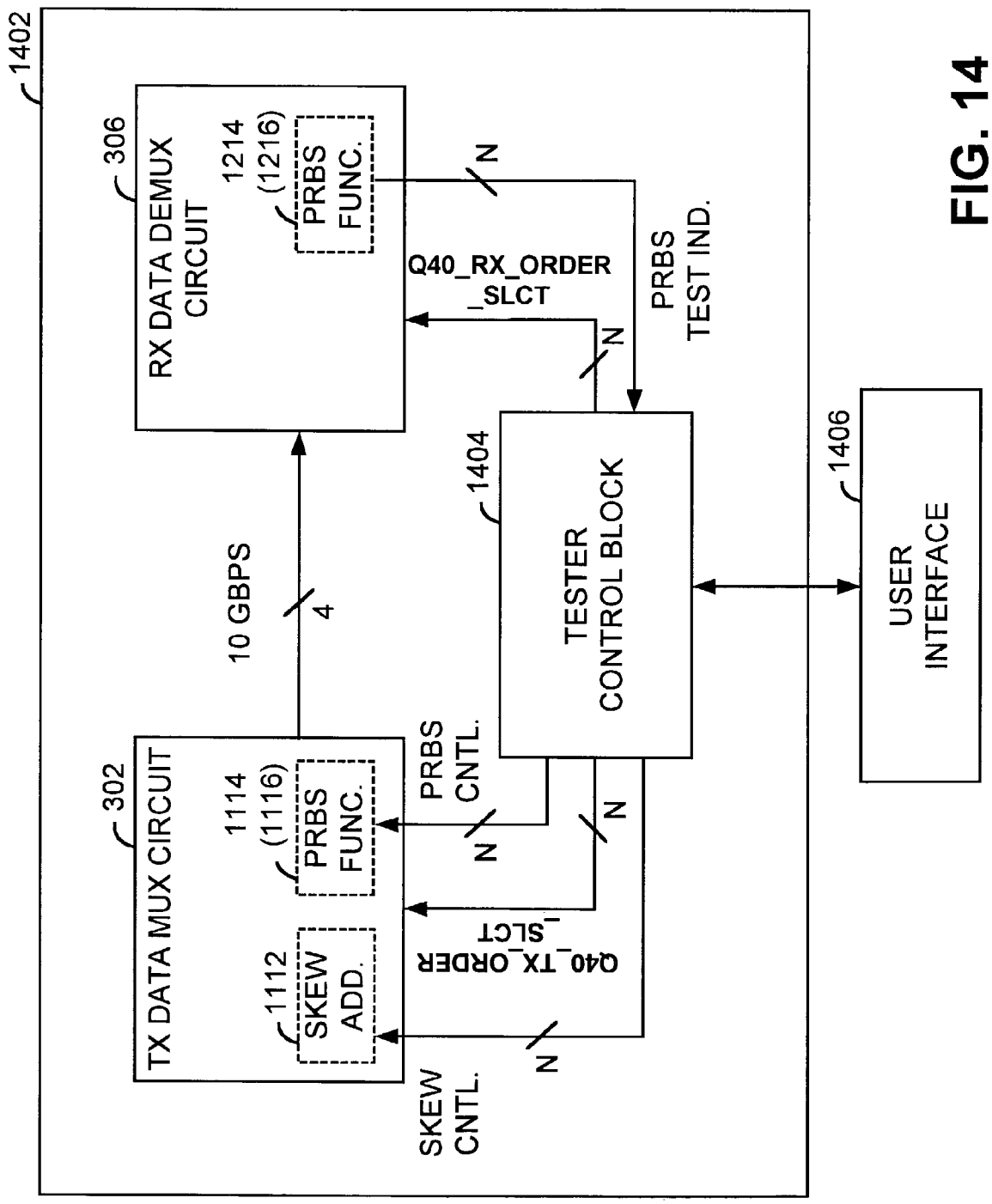
Figure 15:
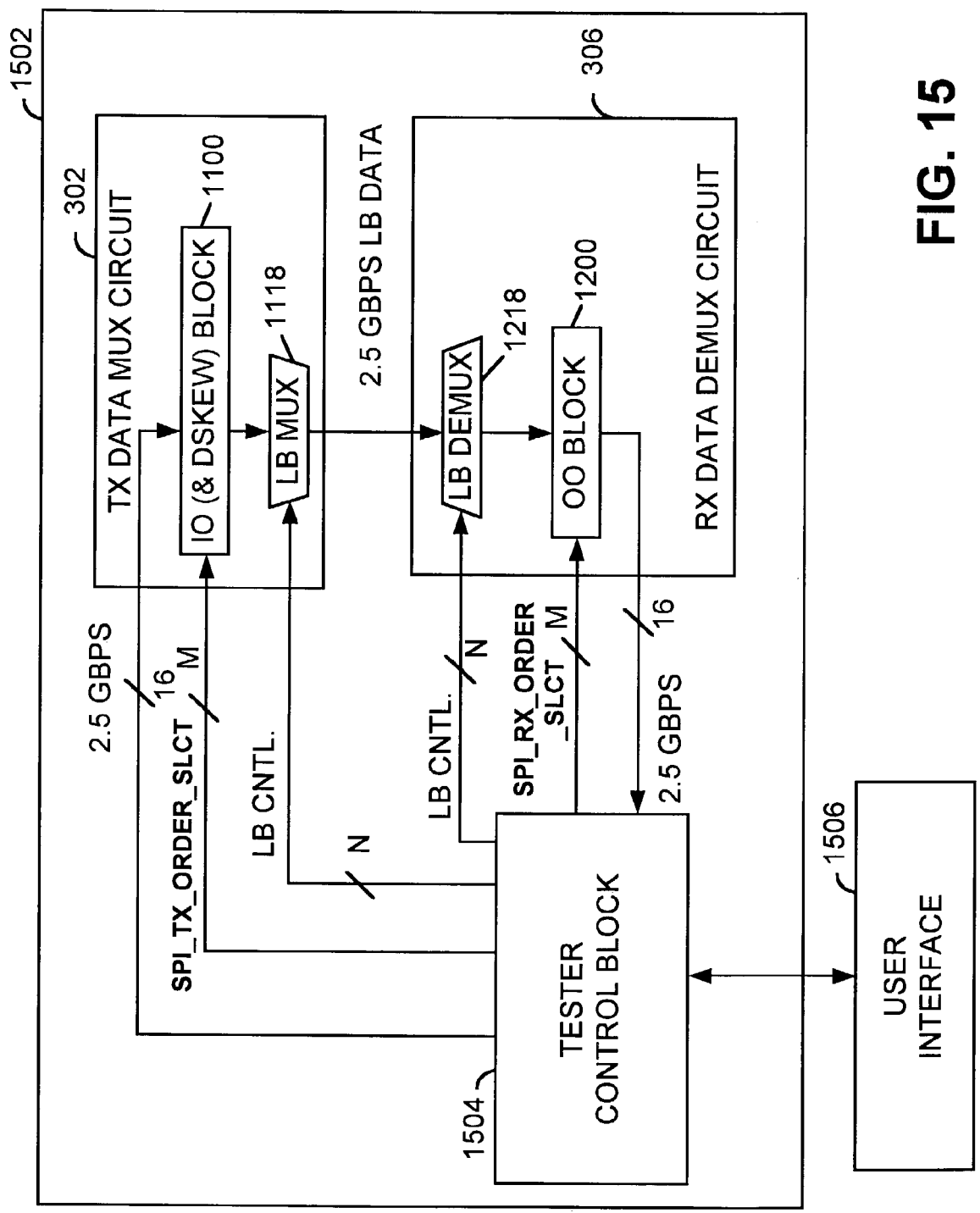
Figure 16:
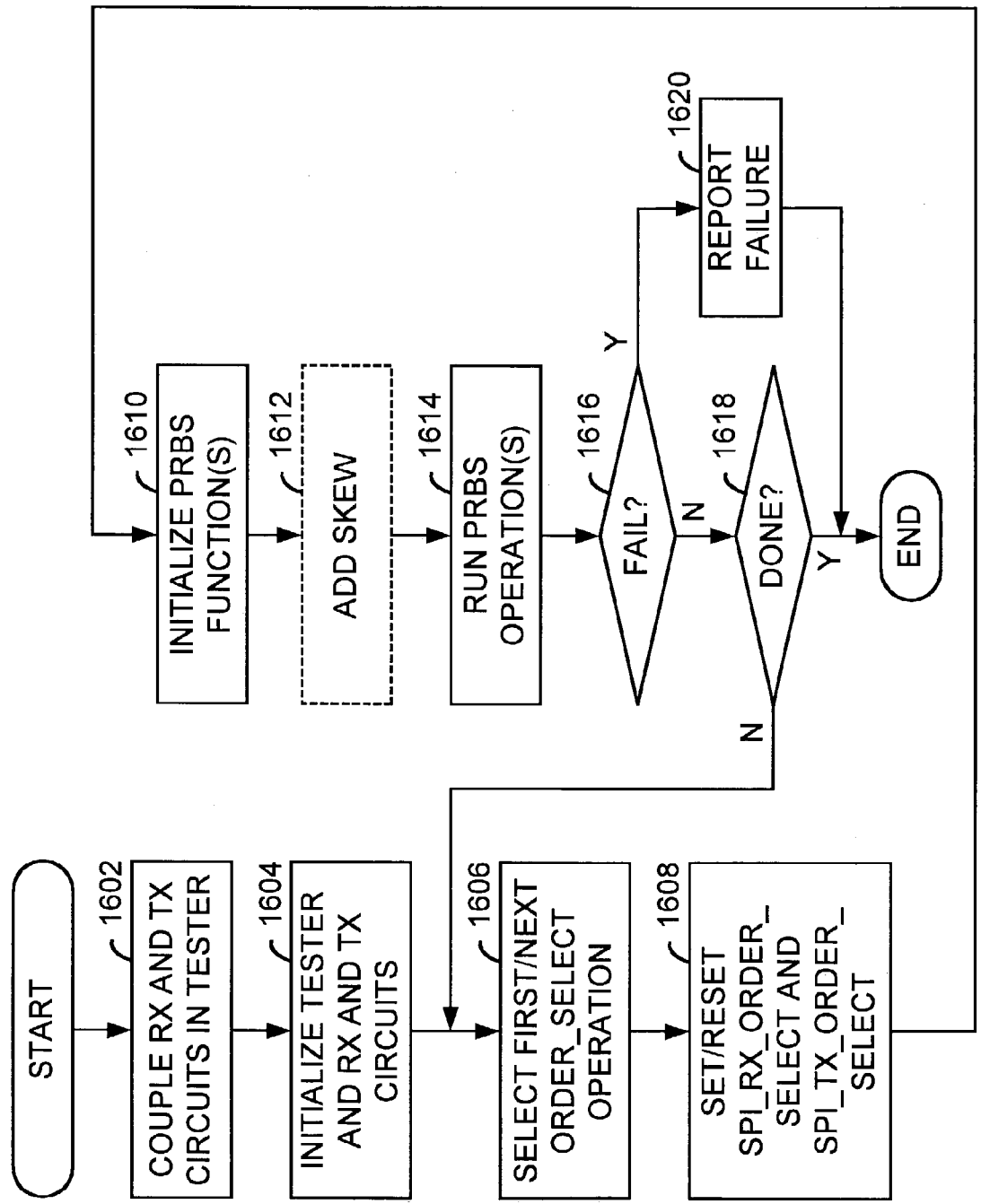
Figure 17:
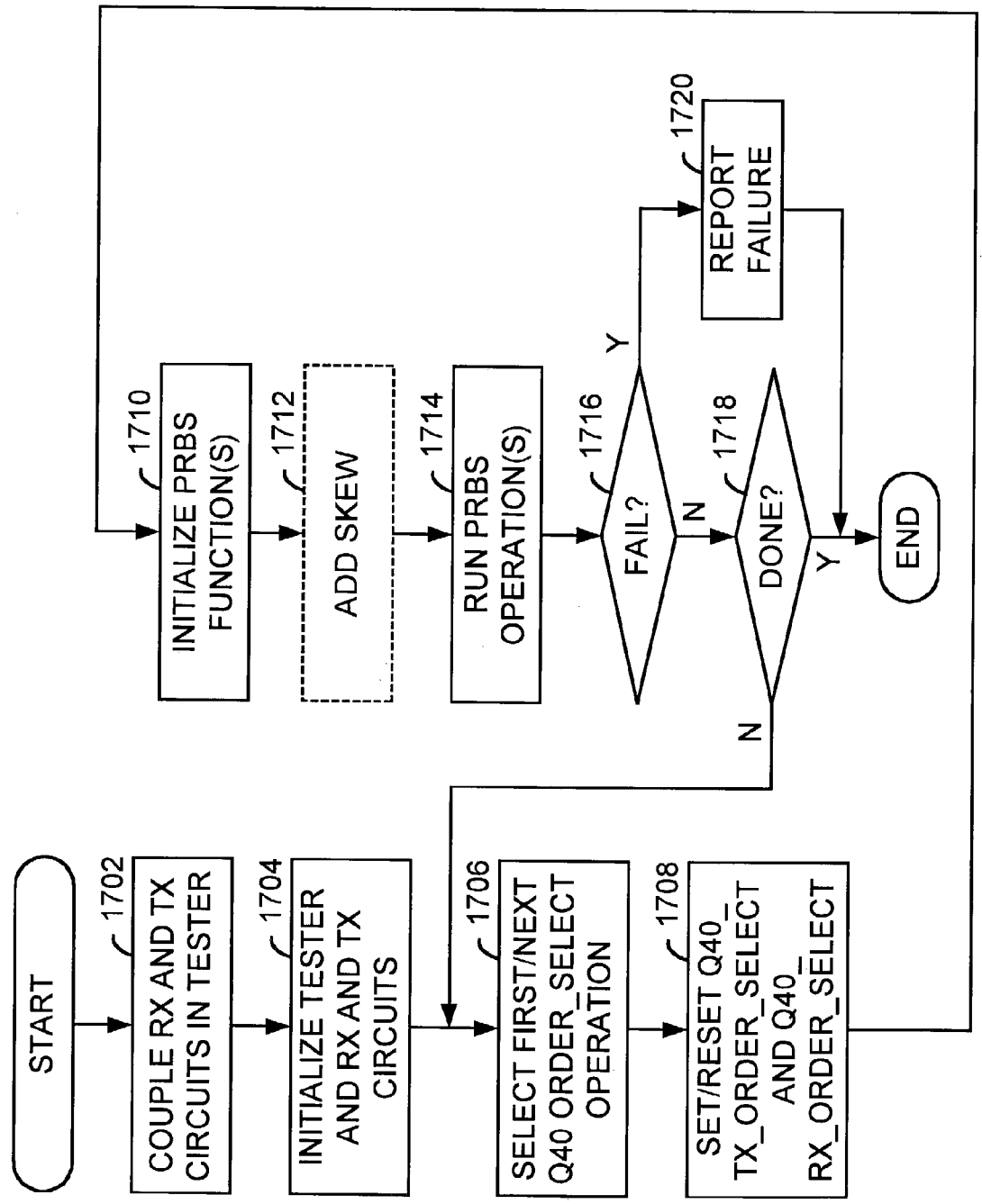
Figure 18:
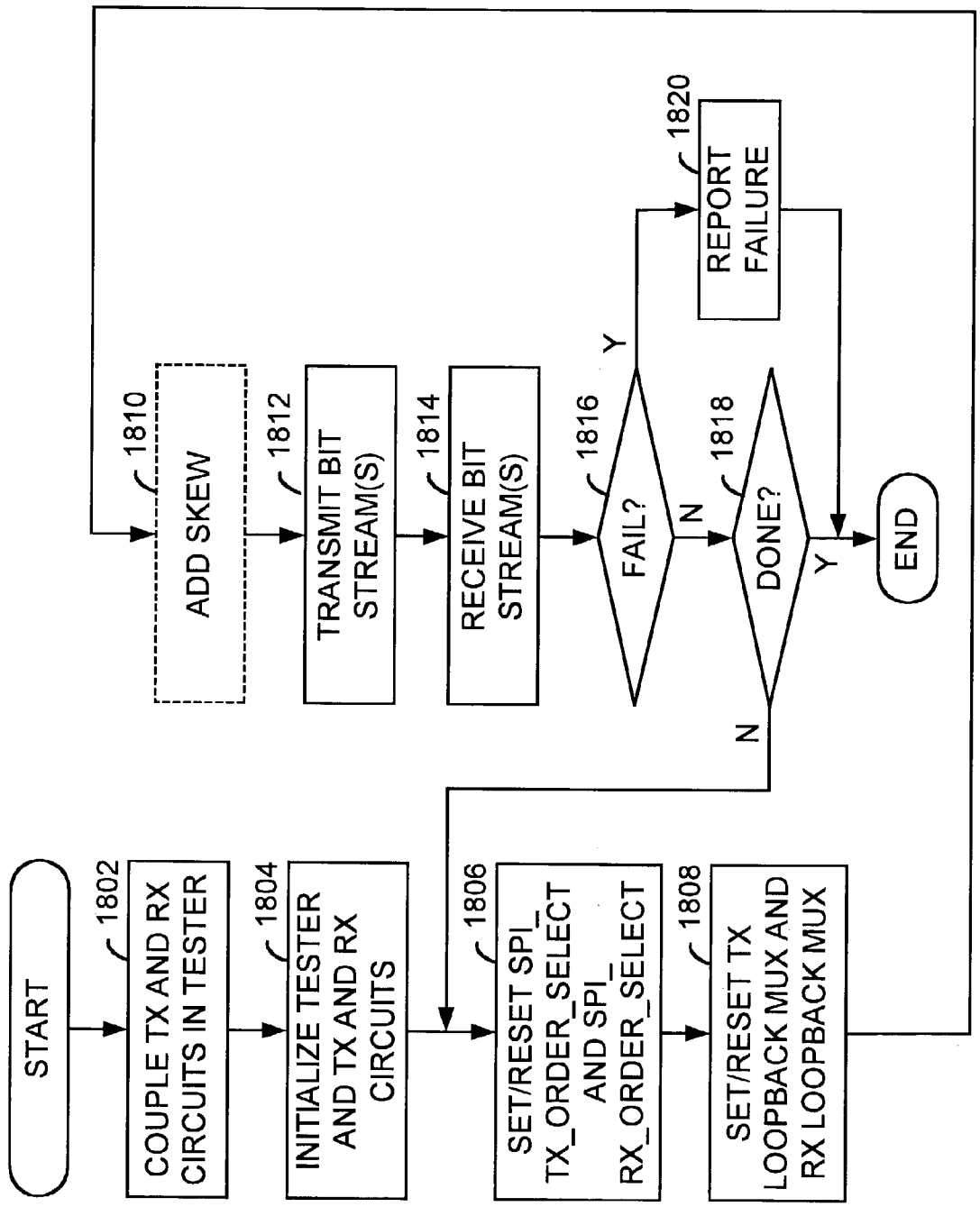

FIG. 12B is a block diagram illustrating a second embodiment of the first RX data demultiplexing integrated circuit of FIG. 8A with particular detail relating to BIST structures contained therein;

FIG. 13 is a block diagram illustrating the first TX data multiplexing integrated circuit and the first RX data demultiplexing integrated circuit having their respective 16 bit 2.5 GBPS links tested within a circuit tester;

FIG. 14 is a block diagram illustrating the first TX data multiplexing integrated circuit and the first RX data demultiplexing integrated circuit having their respective 4 bit 10 GBPS links tested within a circuit tester;

FIG. 15 is a block diagram illustrating the first TX data multiplexing integrated circuit and the first RX data demultiplexing integrated circuit having their respective 16 bit 2.5 GBPS links tested within a circuit tester using built in loop back testing structures in a first tester operation;

FIG. 16 is a flow chart illustrating the testing operations performed with the structure of FIG. 13;

FIG. 17 is a flow chart illustrating the testing operations performed with the structure of FIG. 14; and FIG. 18 is a flow chart illustrating the testing operations performed with the structure of FIG. 15.

DETAILED DESCRIPTION OF THE INVENTION

Figure 1:
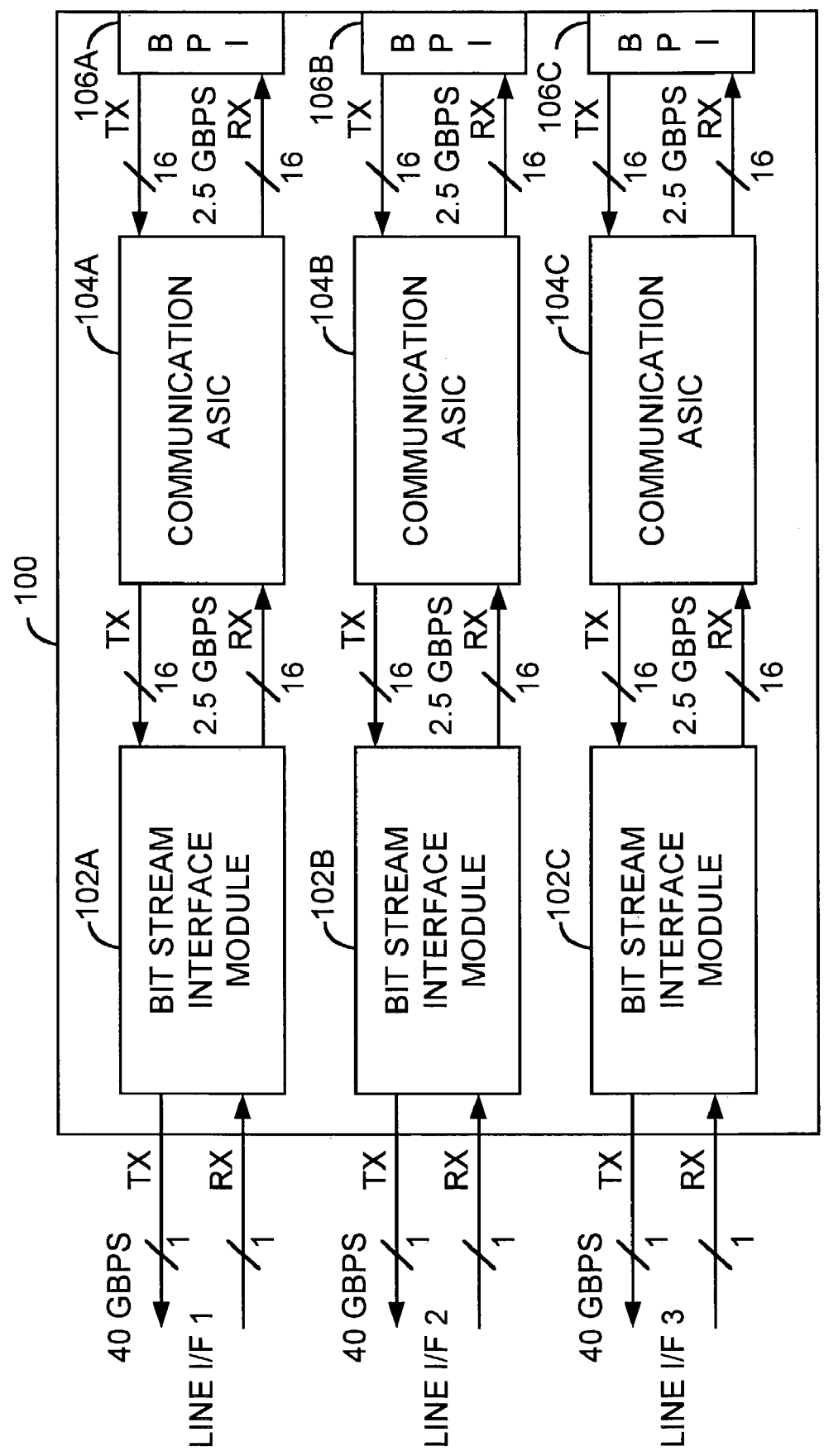
FIG. 1 is a block diagram illustrating a Printed Circuit Board (PCB) that has mounted thereon a plurality of Bit Stream Interface Module (BSIMs) constructed according to the present invention.

FIG. 1 is a block diagram illustrating a Printed Circuit Board (PCB) that has mounted thereon a plurality of Bit Stream Interface Module (BSIMs) constructed according to the present invention. As shown in FIG. 1, the PCB 100 includes BSIMs 102A, 102B and 102C. The PCB 100 also includes mounted thereupon communication Application Specific Integrated Circuits (ASIC) 104A, 104B, and 104C. The PCB 100 is mounted within a housing that services switching requirements within a particular location or geographic area. Each of the BSIMs 102A, 102B, and 102C couples to a high-speed media such as an optical fiber via a respective media interface and supports the OC-768 or the SEC-768 standard at such media interface. On the second side of the BSIMs 102A through 102C, the SFI-5 interface standard is supported. Communication ASIC 104A through 104C may communicate with other PCB components located in the housing via back interfaces 106A through 106C.

The BSIMs 102A through 102C may be removably mounted upon the PCB 100. In such case, if one of the BSIMs 102A through 102C fails it may be removed and replaced without disrupting operation of other devices on the PCB 100. When the BSIMs 102-102C are removably mounted upon the PCB 100, they are received by a socket or connection coupled to the PCB 100. Further, in such embodiment, the BSIMs 102A-102C may be constructed on a separate PCB.

Figure 2A:
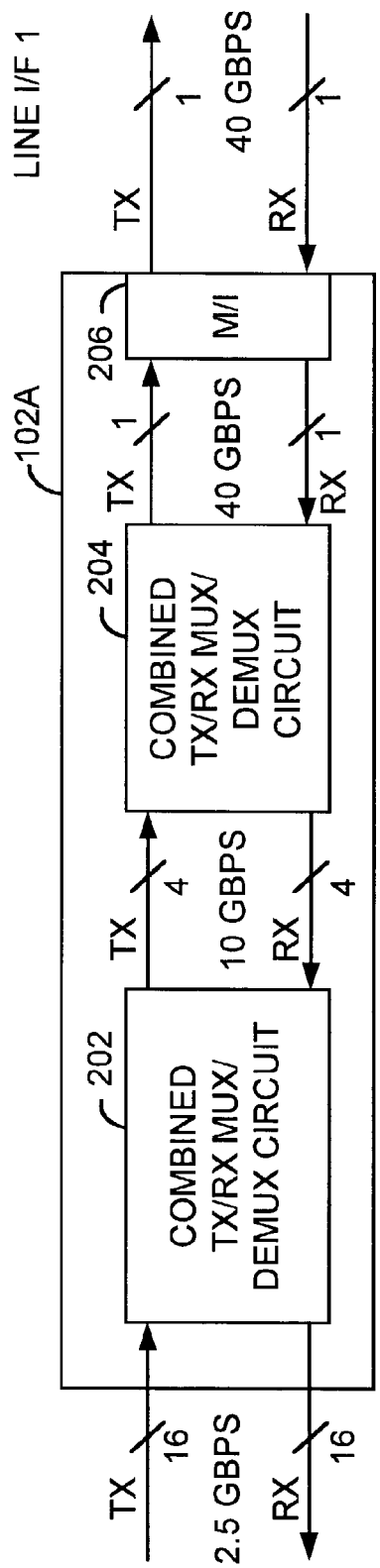
FIG. 2A is a block diagram illustrating one embodiment of a BSIM constructed according to the present invention.

FIG. 2A is a block diagram illustrating one embodiment of a BSIM 102A constructed according to the present invention. The BSIM 102A of FIG. 2A includes a first combined TX/RX multiplexing/demultiplexing integrated circuit 202 and a second combined TX/RX multiplexing/demultiplexing integrated circuit 204. On the line side of the BSIM 102A, the first combined TX/RX multiplexing/demultiplexing integrated circuit 204 couples to a media, e.g., fiber optic cable or copper cable, via a media interface 206. The media interface 206 couples to the combined TX/RX multiplexing/demultiplexing integrated circuit 204 via a 40 GPS nominal bit rate, one bit transmit and one bit receive interface. The TX and RX line medias themselves each support one bit 40 Giga bits-per-second (GBPS) nominal bit rate communications, such as is defined by the OC-768 and/or SEC 768 specifications of the OIF.

The combined TX/RX multiplexing/demultiplexing integrated circuit 202 interfaces with a communication ASIC, e.g. 104A, via 16 TX bit lines and 16 RX bit lines, each operating at a nominal bit rate of 2.5 GBPS. Such interface supports a nominal total throughput of 40 GBPS (16*2.5 GBPS). The interface between the combined TX/RX multiplexing/demultiplexing integrated circuit 202 and the combined TX/RX multiplexing/demultiplexing integrated circuit 204 includes 4 TX bit lines and 4 RX bit lines, each operating at a nominal rate of 10 GBPS. This interface supports a nominal total throughput of 40 GBPS (4*10 GBPS). This interface may operate substantially or fully in accordance with an operating standard known as the Q40 operating standard. However, the teachings of the present invention are not limited to according to operation of the Q40 standard or is the description here intended to be a complete description of the Q40 standard itself.

Figure 2B:
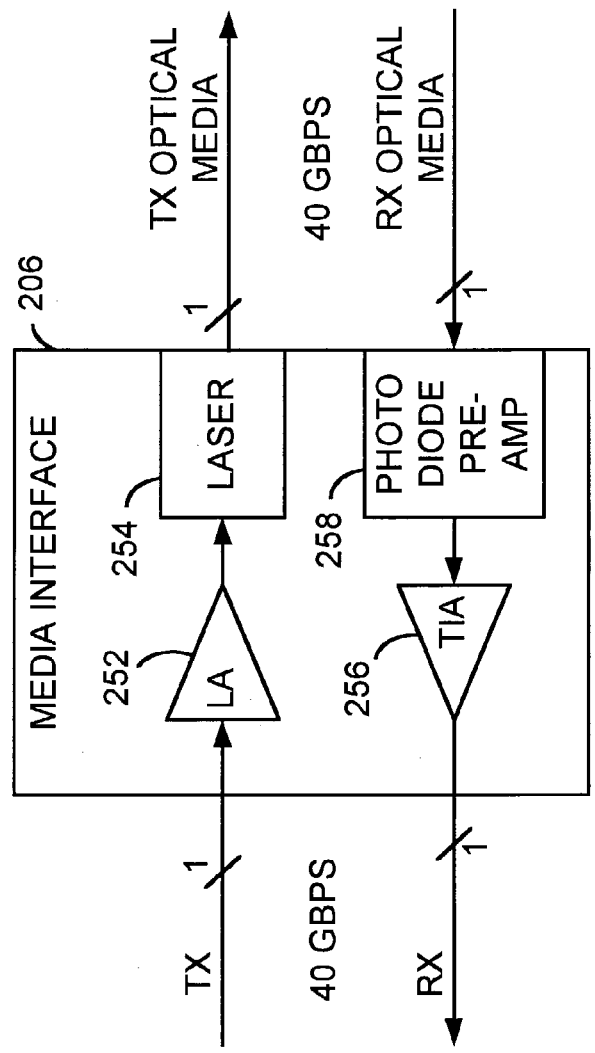
FIG. 2B is a block diagram illustrating an optical media interface that may be included wit the BSIM of FIG. 2A.

FIG. 2B is a block diagram illustrating an optical media interface that may be included with the BSIM of FIG. 2A. As shown in FIG. 2B, media interface 206 couples to an optical media on a first side and couples to the combined TX/RX multiplexing/demultiplexing integrated circuit 204 on a second side. In the transmit path, the media interface 206 receives a single bit stream at a nominal bit rate of 40 GBPS from the combined TX/RX multiplexing/demultiplexing integrated circuit 204. The TX bit stream is amplified by limiting amplifier 252 to produce a bit stream output that is coupled to laser 254. The laser produces an optical signal that is coupled to TX optical media.

On the receive side, an RX optical media produces the RX bit stream at a nominal bit rate of 40 GBPS. The RX bit stream is received by a photo diode/pre-amplifier combination 258. The photo diode/pre-amplifier combination 258 produces an output that is received by a transimpedance amplifier 256. The output of the transimpedance amplifier 256 is a single bit stream at a nominal bit rate of 40 GBPS that is provided to the combined TX/RX multiplexing/demultiplexing integrated circuit 204 of FIG. 2A.

Figure 3:
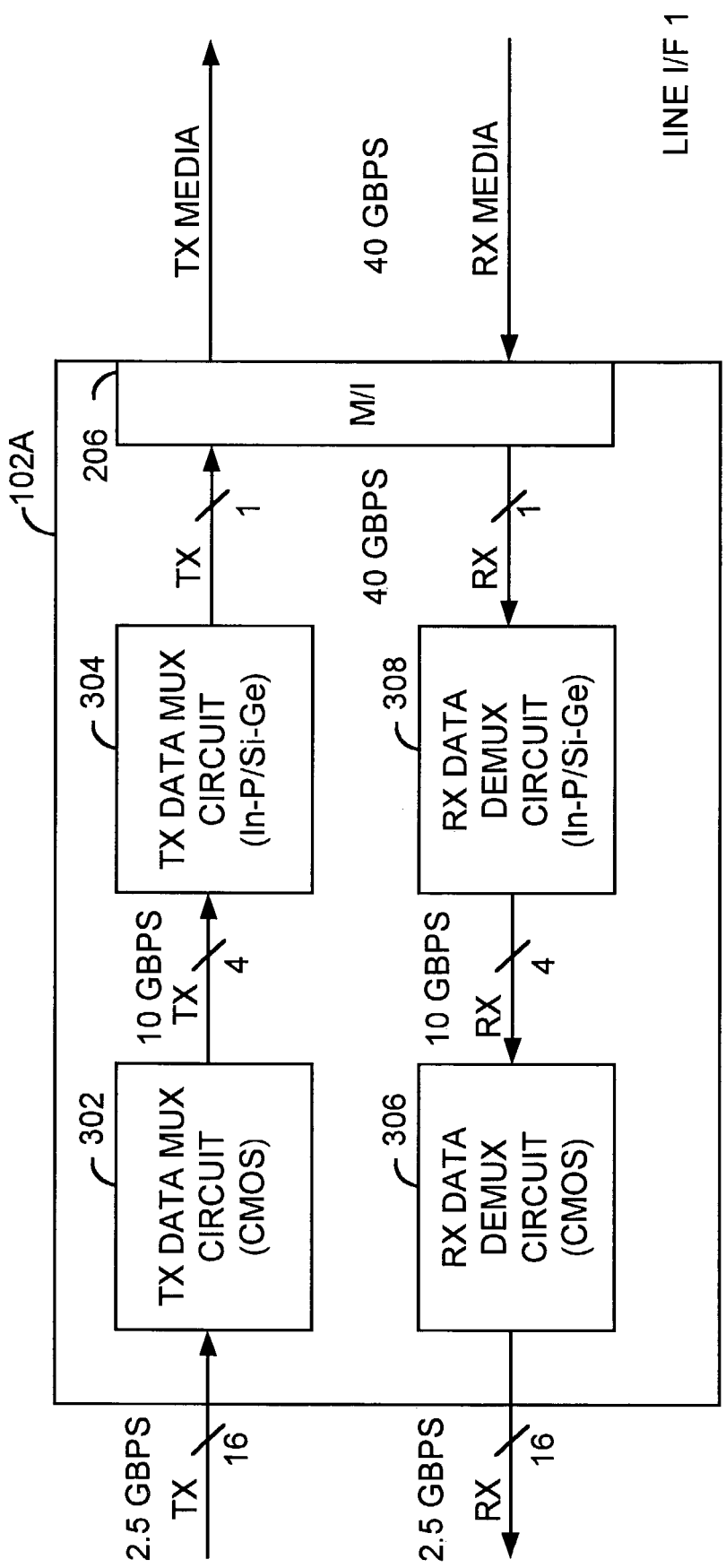
FIG. 3 is a block diagram illustrating another embodiment of a BSIM constructed according to the present invention.

FIG. 3 is a block diagram illustrating another embodiment of a BSIM constructed according to the present invention. The embodiment of FIG. 3 differs from the embodiment of FIG. 2A in that separate TX and RX circuit components are employed. While the media interface 206 of FIG. 3 is shown to be a single device such as shown in FIG. 2B, in other embodiments, the media interface 206 may be formed in separate circuits corresponding to the separate TX and RX paths shown in FIG. 2B.

In the TX path, TX data multiplexing integrated circuit 302 receives a 16 bit wide by 2.5 GBPS nominal bit rate input from a coupled ASIC and produces a 4 bit wide×10 GBPS nominal bit rate TX output. In the embodiment described herein, the TX data multiplexing integrated circuit 302 is constructed in a Silicon CMOS process, for example in a 0.13 micron CMOS process. The TX data multiplexing integrated circuit 302 multiplexes the 16 bit wide by 2.5 GBPS nominal bit rate input to produce a 4 bit wide 10 GBPS nominal bit rate output, which is received by the TX data multiplexing integrated circuit 304. The TX data multiplexing integrated circuit 304 multiplexes the 4 bit wide x 10 GBPS nominal bit rate output to produce a single bit wide output at a nominal bit rate of 40 GBPS.

The TX data multiplexing integrated circuit 304 must switch at a frequency that is at least four times the rate at which the TX data multiplexing integrated circuit 302 must switch. For this reason, the TX data multiplexing integrated circuit 304 is constructed in an Indium-Phosphate process or in a Silicon-Germanium process. Each of these processes supports the higher switching rates required at the 40 GBPS output of the TX data multiplexing integrated circuit 304. Thus in combination the TX data multiplexing integrated circuit 302 constructed in a CMOS process and the TX data multiplexing integrated circuit 304 constructed in an Indium-Phosphate or Silicon-Germanium process will provide a high performance relatively low cost solution to the interfacing of a 2.5 GBPS nominal bit rate 16 bit wide interface and a 40 GBPS 1 bit wide interface.

Likewise, in the RX path, the bit stream interface module 102A includes an RX data demultiplexing integrated circuit 308 that receives a single bit stream at a nominal bit rate of 40 GBPS data. The RX data demultiplexing integrated circuit 308 produces a 4 bit wide×10 GBPS nominal bit rate output. The RX data demultiplexing integrated circuit 306 receives the 4 bit wide×10 GBPS nominal bit rate output and produces a 16 bit wide×2.5 GBPS nominal bit rate receive data stream.

As was the case with the TX data multiplexing integrated circuit 302 and the TX data multiplexing integrated circuit 304, the RX data demultiplexing integrated circuit 306 and the RX data demultiplexing integrated circuit 308 are formed in differing process types. In particular the RX data demultiplexing integrated circuit 306 is constructed in a Silicon CMOS process. Further, the RX data demultiplexing integrated circuit 308 is constructed in an Indium-Phosphate or Silicon-Germanium process so that the RX demultiplexer circuit 308 will support the higher switching speeds of the 1 bit wide×40 GBPS interface to the media interface 206.

Figure 4A:
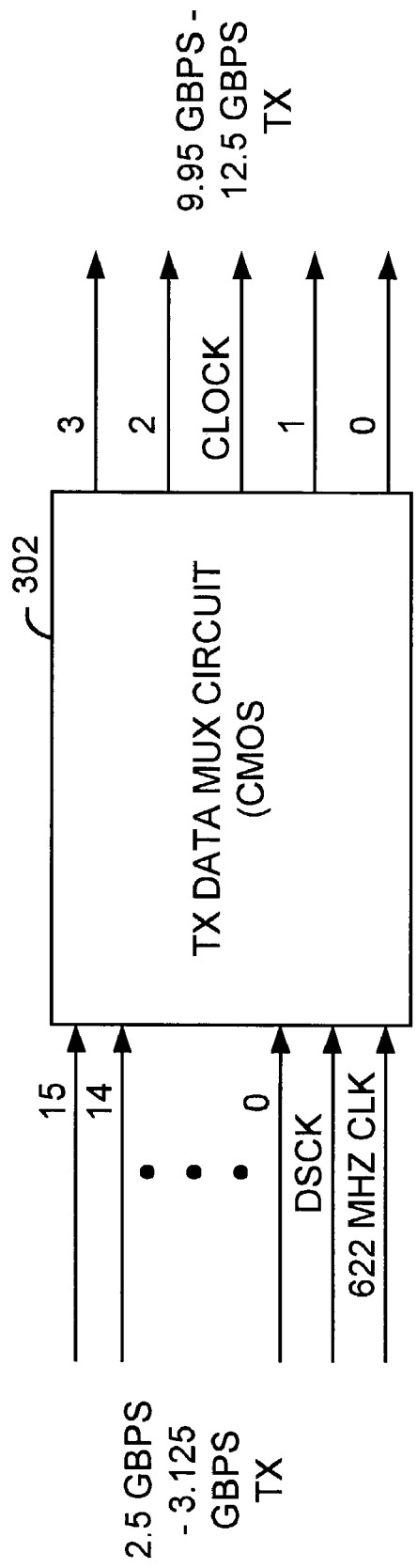
FIG. 4A is a block diagram illustrating a TX data multiplexing integrated circuit constructed according to the present invention.

FIG. 4A is a block diagram illustrating a TX data multiplexing integrated circuit constructed according to the present invention. As shown in FIG. 4A, the TX data multiplexing integrated circuit 302 receives 16 bit steams of data at nominal bit rate of 2.5 GBPS on each bit line from the communication ASIC 104A. Each bit line of this 16 bit wide interface however can operate at bit rates of up to 3.125 GBPS. This interface also includes DSCD Data and a 622 MHz clock. The output of the TX data multiplexing integrated circuit 302 includes 4 bit lines, each of which supports a nominal bit rate of 10 GBPS. However, the output of the TX data multiplexing integrated circuit can produce data at bit rates of between 9.95 GBPS and 12.5 GBPS. The TX data multiplexing integrated circuit 302 also produces a clock signal at one-half the nominal bit rate of the 4 bit stream paths. In such case, when the nominal bit rate of the data paths is 10 GBPS, the clock will be produced at 5 GHz.

Figure 4B:
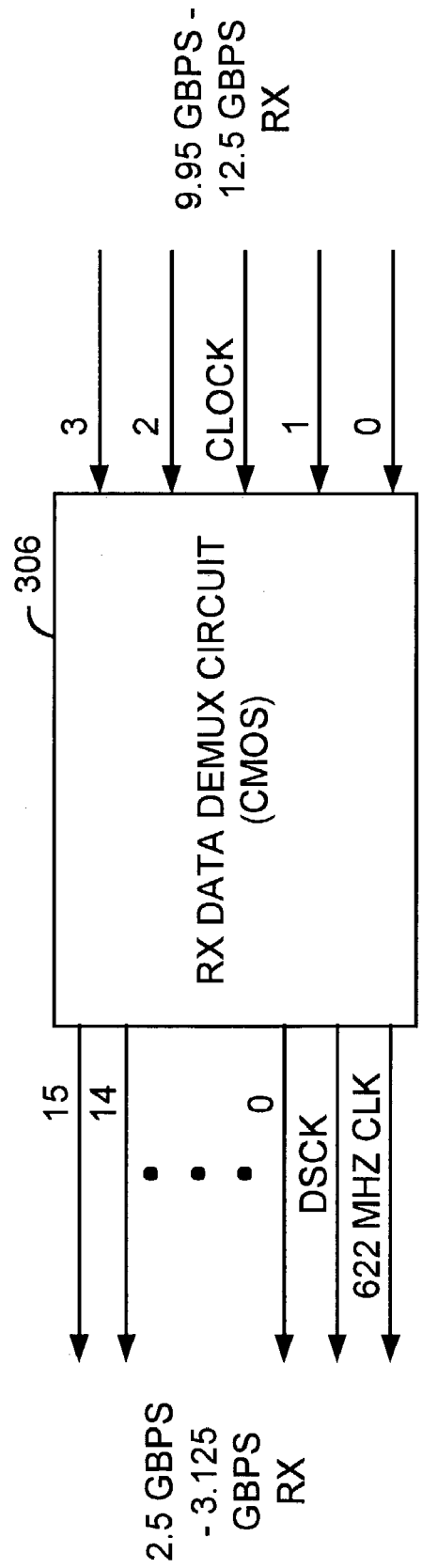
FIG. 4B is a block diagram illustrating an RX data demultiplexing integrated circuit constructed according to the present invention.

FIG. 4B is a block diagram illustrating an RX data demultiplexing integrated circuit 306 constructed according to the present invention. As shown in FIG. 4B, the RX data demultiplexing integrated circuit 306 receives 4 bit streams at nominal bit rates of 10 GBPS each but may operate in the range of 9.95 GBPS to 12.5 GBPS. The RX data demultiplexing integrated circuit 306 also receives a clock signal at one-half the nominal bit rate of the 4 bit stream paths. In such case, when the nominal bit rate of the data paths is 10 GBPS, the clock is received at 5 GHz. The RX data demultiplexing integrated circuit 306 produces 16 bit stream outputs at a nominal bit rate of 2.5 GBPS and DSCD Data. However, the RX data demultiplexing integrated circuit 306 may produce the 16 bit streams output at a bit rate of between 2.5 GBPS and 3.125 GBPS.

Figure 5:
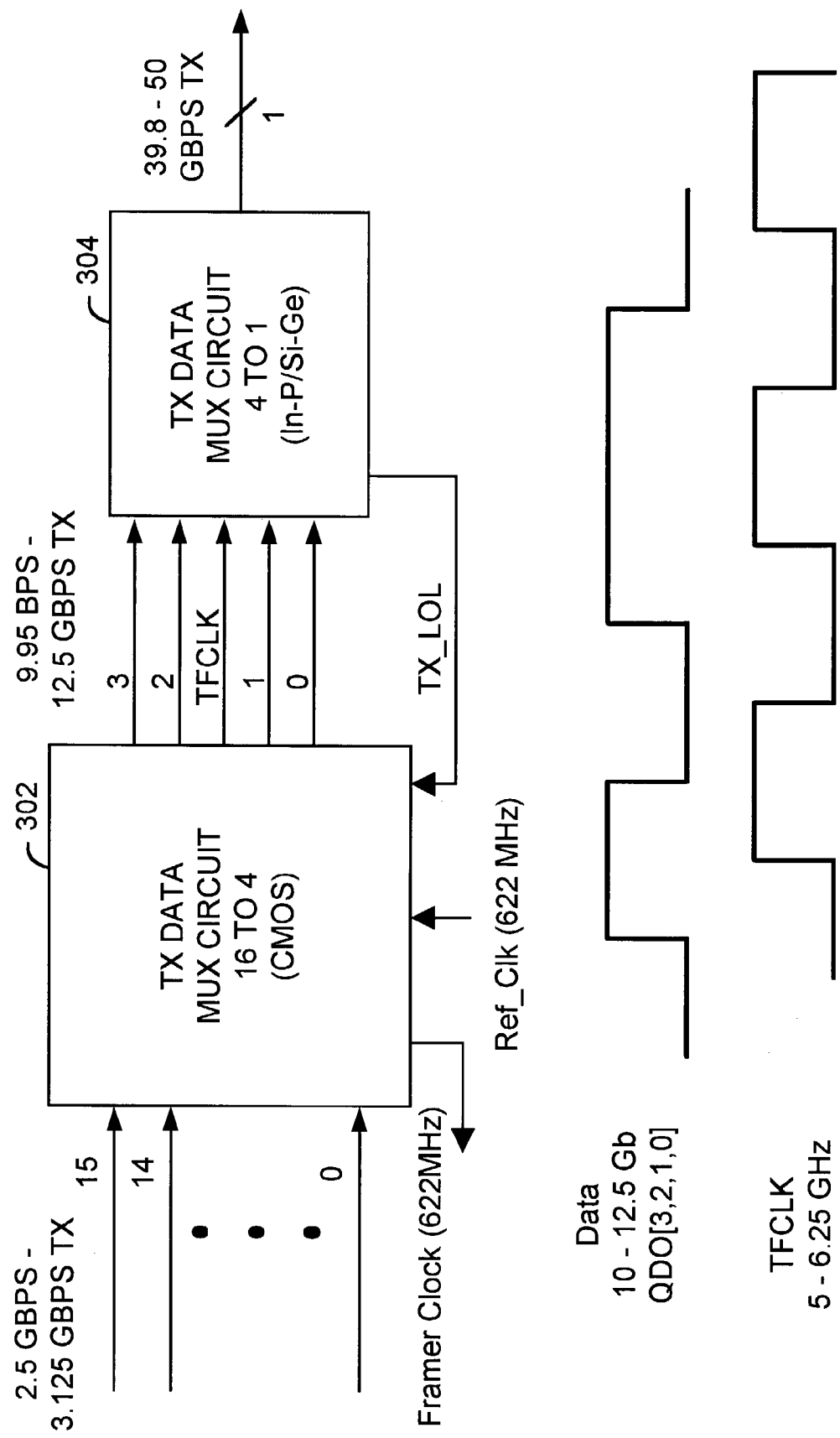
FIG. 5 is a block diagram illustrating the TX data multiplexing integrated circuits of FIG. 3 and the interfaces serviced thereby.

FIG. 5 is a block diagram illustrating the TX data multiplexing integrated circuits 302 and 304 of FIG. 3 and the interfaces serviced thereby. As is shown in FIG. 5, the TX data multiplexing integrated circuit 302 receives 16 bit streams at nominal bit rates of 2.5 GBPS and produces 4 bit streams at nominal bit rates of 10 GBPS. Such operation corresponds to a 16 to 4 multiplexing operation. The TX data multiplexing integrated circuit 302 also produces a framer clock output at 622 MHz, receives a reference clock input at 622 MHz, and also receives a loss of lock signal (TX_LOL) signal from the TX data multiplexing integrated circuit 304.

Further, the TX data multiplexing integrated circuit 304 receives the 4 bit streams at nominal bit rates of 10 GBPS and produces the single bit output at a nominal bit rate of 40 GBPS. However, the TX data multiplexing integrated circuit 304 that performs the 4:1 multiplexing may operate at an output rate of between 39.8 GBPS and 50 GBPS. The bit rates indicated herein are provided not to limit the scope of the present invention but only to describe contemplated embodiments for implementing the teachings of the present invention.

The signal transition diagrams of FIG. 5 indicating the data and the TFCLK signal show that the bit rate is twice the rate of the TFCLK signal. In such case, data is latched on the 4 bit×10 GBPS link at each transition of the TFCLK.

FIG. 6 is a block diagram illustrating the RX data demultiplexing integrated circuits 306 and 308 of FIG. 3 and the interfaces serviced thereby. As is shown in FIG. 6, the RX data demultiplexing integrated circuit 308 receives a single bit stream at a nominal bit rate of 40 GBPS. However, the single bit stream input may operate at bit rates from between 39.8 GBPS and 50 GBPS. The RX data demultiplexing integrated circuit 308 performs a 1:4 demultiplexing operation on the received single bit stream to produce 4 output bit streams at a nominal bit rate of 10 GBPS. However, the RX data demultiplexing integrated circuit 308 may also produce output at bit rates from 9.95 GBPS to 12.5 GBPS.

The RX data demultiplexing integrated circuit 306 receives the 4 bit streams having nominal bit rates of 10 GBPS each and a QCLKI signal and a RX_LOL signal from the RX data demultiplexing integrated circuit 308. Based upon these input signals, the RX data demultiplexing integrated circuit 306 produces the 16 bit stream outputs at nominal bit rates of 2.5 GBPS. Also shown in FIG. 6, the QCLKI signal operates at one-half the frequency of the bit rate of the data stream received from the RX data demultiplexing integrated circuit 308. Thus, in such case, for the nominal bit rate of 10 GBPS, the QCLKI signal will be provided at 5 GHz.

FIG. 7A includes a table and a diagram that illustrate operating specifications for the TX interface between the TX data multiplexing integrated circuits of FIG. 3. FIG. 7 includes the transmitter output and clock specifications 700 and an equivalent circuit 702 upon which these specifications are based. As indicated, the output of the TX data multiplexing integrated circuit 302 is a common mode output. Further, the impedance of the output is 50 ohms single ended and 100 ohms differential. The other properties of the TX data multiplexing integrated circuit 302 output are shown at 700. Further, the equivalent circuit for the interface on the transmit side is indicated at 702.

Figure 7B:
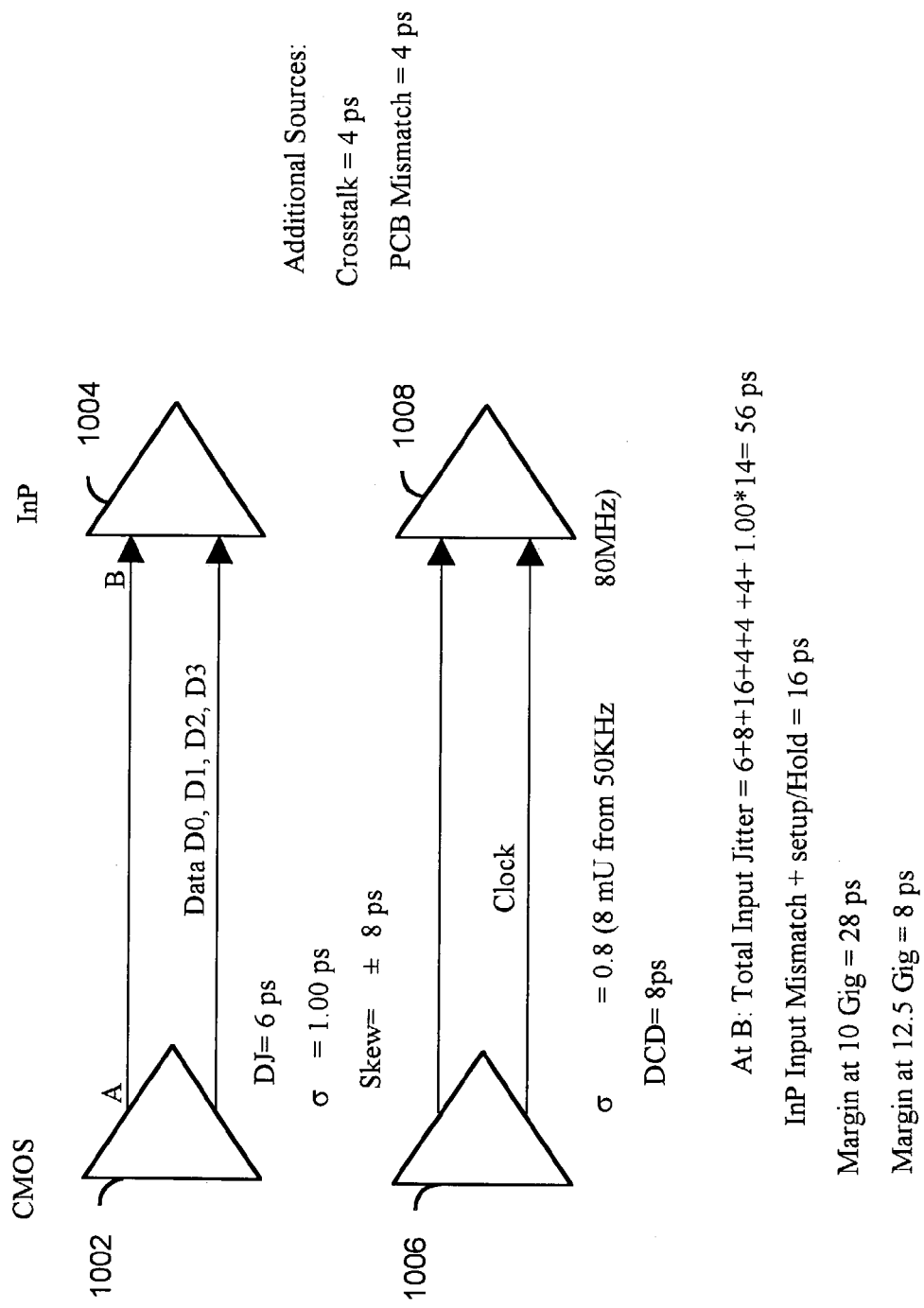
FIG. 7B is a block diagram illustrating the jitter allocation for the TX link between TX data multiplexing integrated circuits of FIG. 3.
Figure 10:
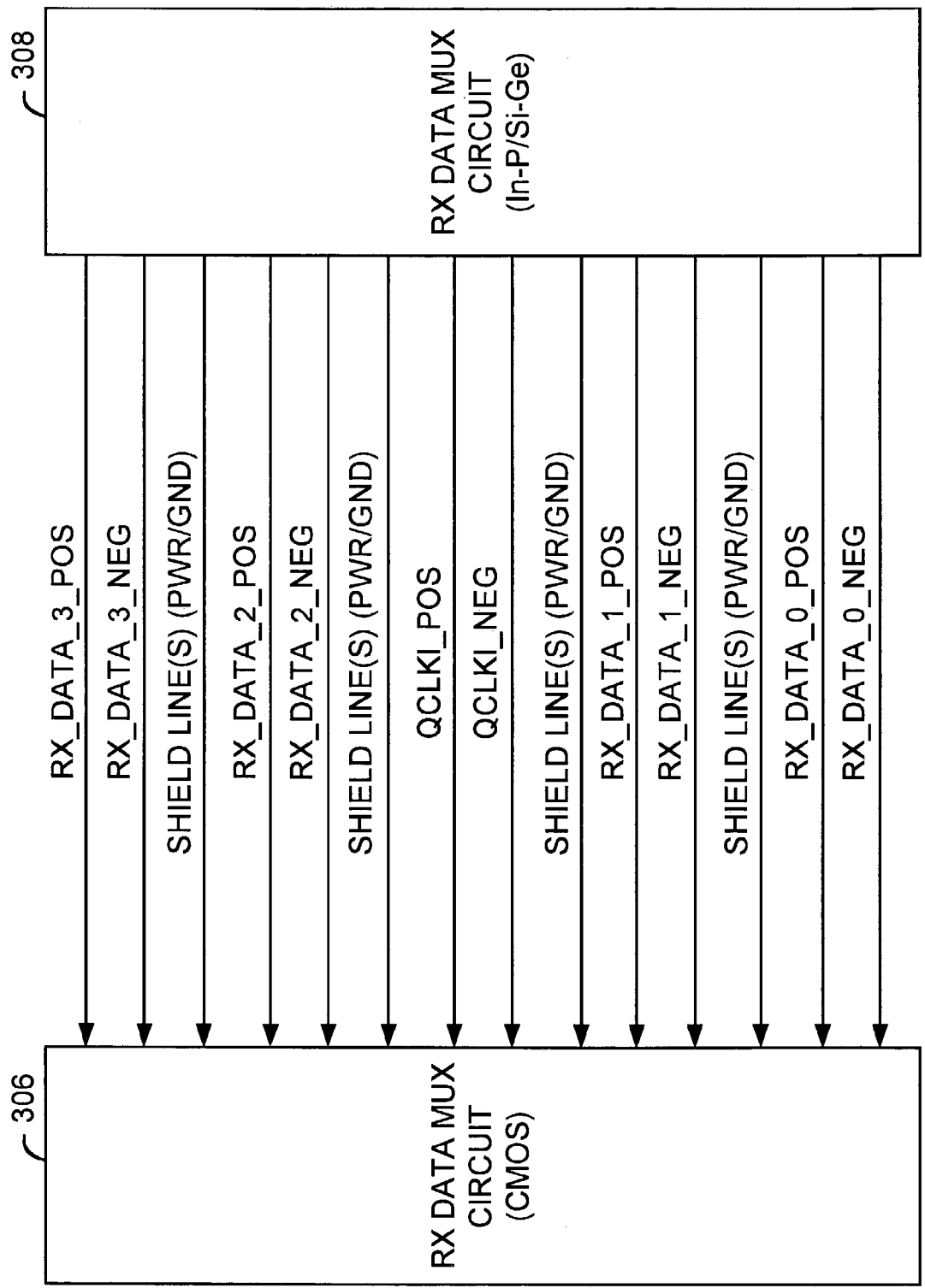
FIG. 10 is a block diagram illustrating a multiple bit stream interface between the RX data demultiplexing integrated circuit and the RX data multiplexing integrated circuit of FIG. 3.

FIG. 7B is a block diagram illustrating the jitter allocation for the TX link between TX data multiplexing integrated circuits of FIG. 3. One of four data differential data line drivers 1002 of the TX data multiplexing integrated circuit 302 and a differential clock driver 1006 of the TX data multiplexing integrated circuit 302 on the 4 bit stream 10 GBPS side are shown. FIG. 10 also illustrates one of four data input buffers 1004 of the TX data multiplexing integrated circuit 304 and a clock input buffer 1008 of the TX data multiplexing integrated circuit 3004. As is indicated, deterministic jitter for the data interface is specified as a maximum of 6 picoseconds. Further, the skew in the data lines with respect to the clock is limited to ±8 picoseconds.

FIG. 8A includes a table and a diagram that illustrate operating specifications for the RX interface between the RX data demultiplexing integrated circuits of FIG. 3. As shown in FIG. 8, the receiver input parameters are shown at 800 and an equivalent circuit thereupon is shown at 802. As is generally illustrated the receiver input parameters are analogous to the transfer parameters of FIG. 7.

Figure 8B:
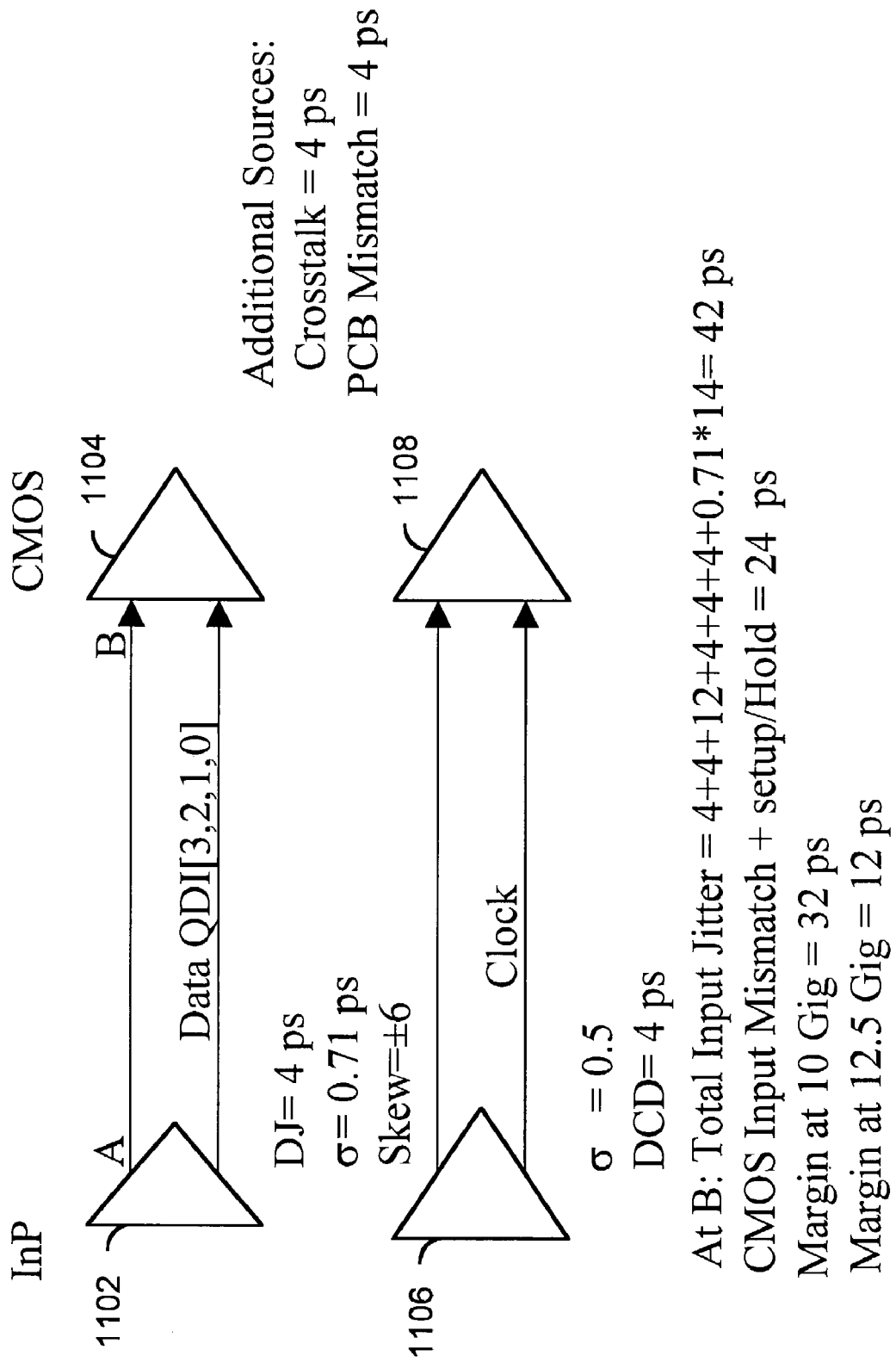
FIG. 8B is a block diagram illustrating the jitter allocation for the RX link between RX data multiplexing integrated circuits of FIG. 3.

FIG. 8B is a block diagram illustrating the jitter allocation for the RX link between RX data demultiplexing integrated circuits of FIG. 3. One of four data differential data line drivers 1102 of the RX data demultiplexing integrated circuit 308 and a differential clock driver 1106 of the RX data demultiplexing integrated circuit 308 on the 4 bit stream 10 GBPS side are shown. FIG. 10 also show one of four data input buffers 1104 of the RX data demultiplexing integrated circuit 306 and a clock input buffer 1108 of the RX data demultiplexing integrated circuit 306. As is indicated, deterministic jitter for the data interface is specified as a maximum of 4 picoseconds. Further, the skew in the data lines with respect to the clock is limited to ±6 picoseconds. The additional information provided in FIG. 11 shows how these jitters may be summed to result at maximum jitters.

Figure 9:
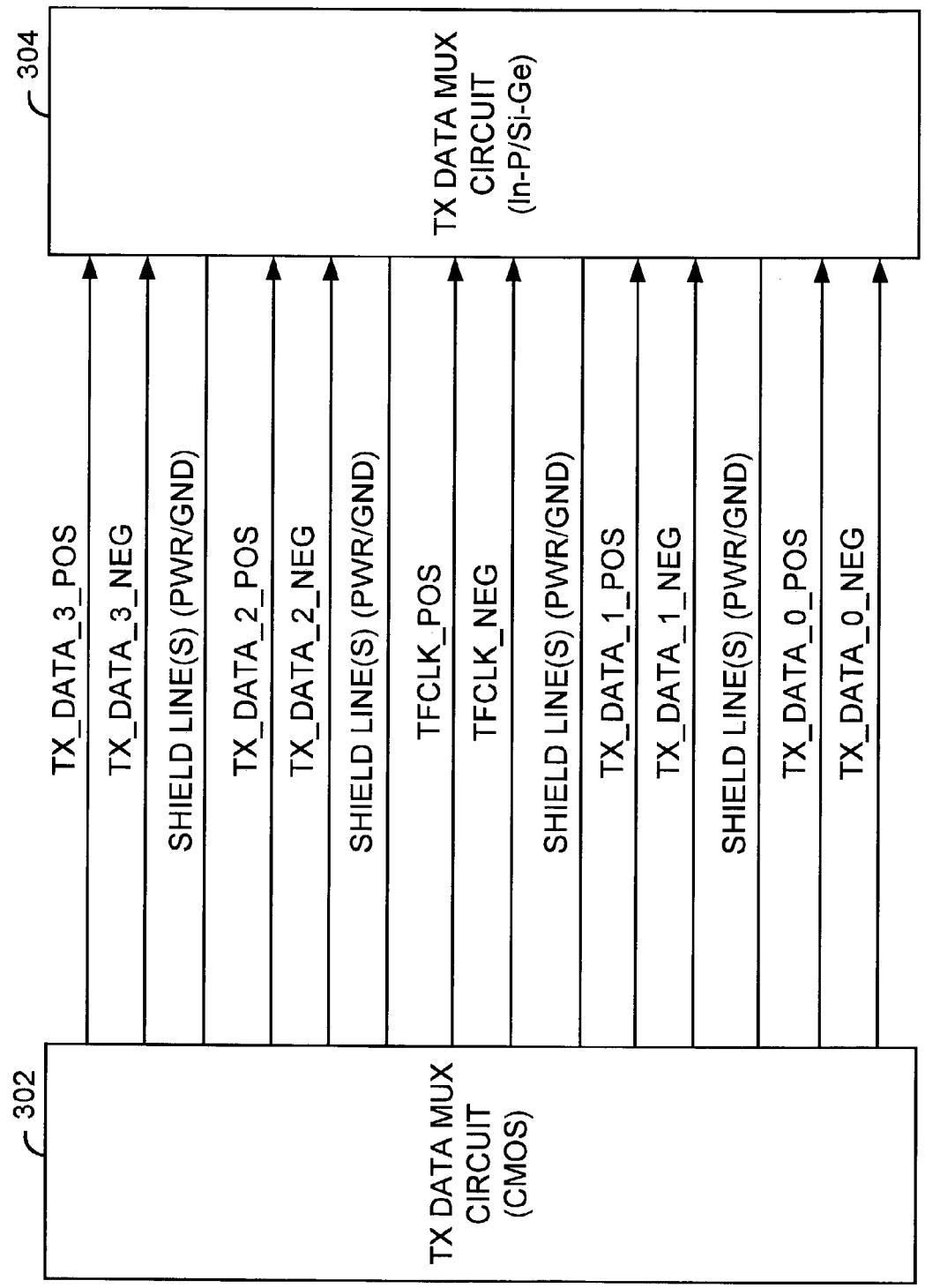
FIG. 9 is a block diagram illustrating a multiple bit stream interface between the TX data multiplexing integrated circuit and the TX data multiplexing integrated circuit of FIG. 3.

FIG. 9 is a block diagram illustrating a multiple bit stream interface between the TX data multiplexing integrated circuit 302 and the TX data multiplexing integrated circuit 304 of FIG. 3. The multiple bit stream interface includes four differential bit streams. A first differential bit stream is indicated by TX_DATA_0_POS and TX_DATA_0_NEG. A second differential bit stream is indicated by TX_DATA_1_POS and TX_DATA_2_NEG. A third differential bit stream is indicated by TX_DATA_2_POS and TX_DATA_2_NEG. A fourth differential bit stream is indicated by TX_DATA_3_POS and TX_DATA_3_NEG. The natural ordering of the bits of the four bit streams of the interface is indicated in FIG. 9A. A differential source centered TFCLK (as shown in FIG. 5) is carried on lines that are centrally located with respect to the lines that carry the differential bit streams. Further, shielding lines, such as grounds and voltages may serve to shield the data lines and the clocks from one another.

FIG. 10 is a block diagram illustrating a multiple bit stream interface between the RX data demultiplexing integrated circuit 308 and the RX data multiplexing integrated circuit 306 of FIG. 3. The multiple bit stream interface includes four differential bit streams. A first differential bit stream is indicated by RX_DATA_0_POS and RX_DATA_0_NEG. A second differential bit stream is indicated by RX_DATA_1_POS and RX_DATA_1_NEG. A third differential bit stream is indicated by RX_DATA_2_POS and RX_DATA_2_NEG. A fourth differential bit stream is indicated by RX_DATA_3_POS and RX_DATA_3 _NEG. The natural ordering of the bits of the four bit streams of the interface are indicated in FIG. 9B. A differential source centered QCLKI (as shown in FIG. 6) is carried on lines that are centrally located with respect to the lines that carry the differential bit streams. Further, shielding lines, such as grounds and voltages may serve to shield the data lines and the clocks from one another.

Figure 11A:
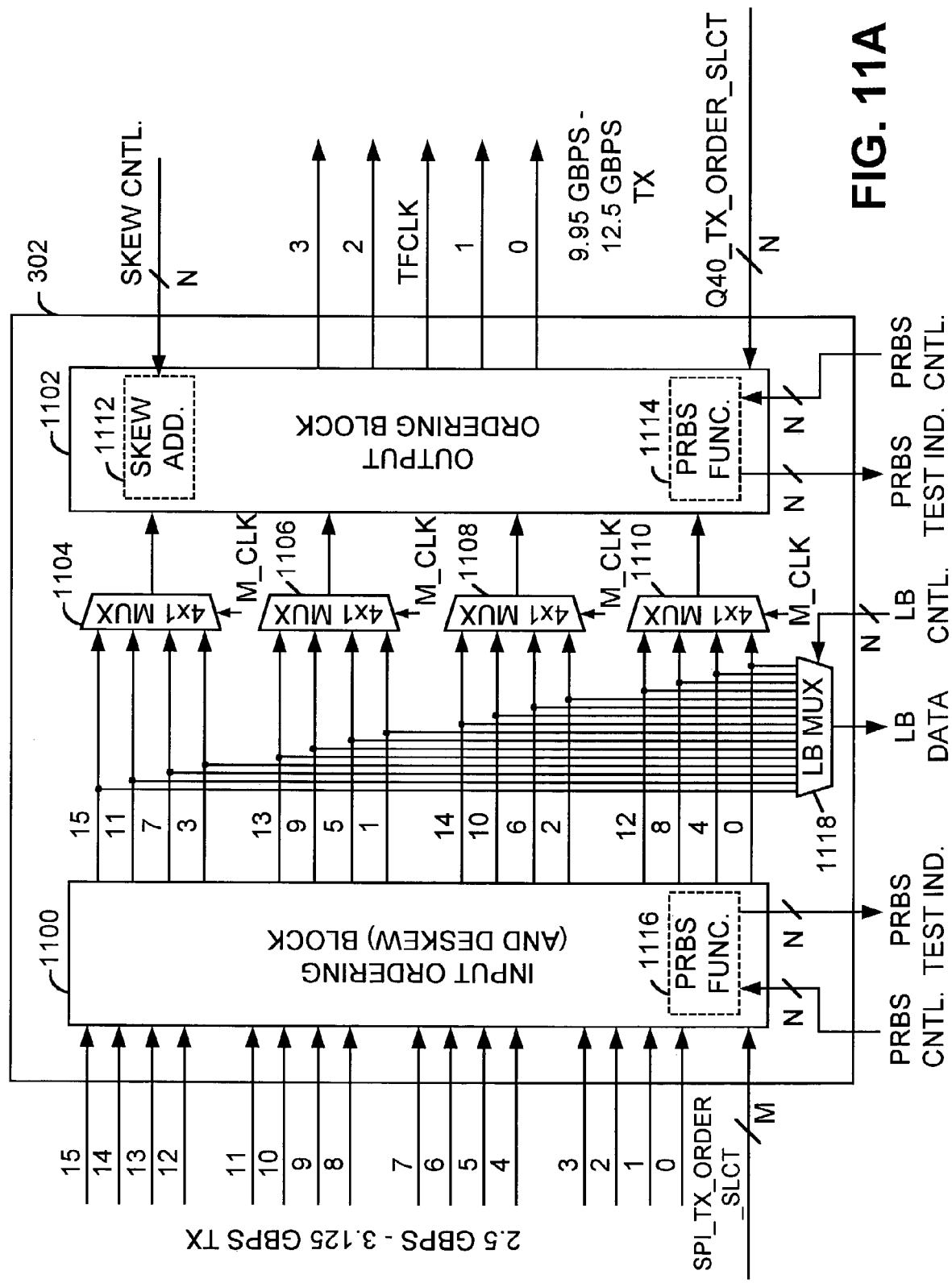
FIG. 11A is a block diagram illustrating a first embodiment of the first TX data multiplexing integrated circuit of FIG. 7A with particular detail relating to Built In Self Test (BIST) structures contained therein.

FIG. 11A is a block diagram illustrating the first TX data multiplexing integrated circuit 1102 of FIG. 11 with particular detail relating to Built In Self Test (BIST) structures contained therein. The first TX data multiplexing integrated circuit 1102 receives 16 bit streams at a nominal bit rate of 2.5 GBPS. An input ordering (and deskew) block 1100 orders and optionally deskews these incoming bit streams based upon a SPI_TX_ORDER_SELECT signal that is M bits wide. A plurality of TX 4×1 multiplexers 1104, 1106, 1108, and 1110 receive the outputs from the input ordering (and deskew) block 1100 and, based upon an M_CLK clock signal, multiplex the input to produce a four bit stream output. The four bit stream output is received by an output ordering block 1102 that produces the four bit streams and the TFCLK of the multiple bit stream interface that interfaces the first TX data multiplexing integrated circuit 302 and the second TX data multiplexing integrated circuit 304 at the nominal bit rate of 10 GBPS. The output ordering block 1102 orders the output bits based upon the N bit wide Q40_TX_ORDER_SELECT signal and outputs the ordered four bit streams of the multiple bit stream interface that are coupled by the four bit stream interface to the second TX data multiplexing integrated circuit 1104.

The input ordering (and deskew) block 1100 of the TX data multiplexing integrated circuit 302 includes a Pseudo Random Bit Stream (PRBS) block 1116. The PRBS function 1116 is capable of coupling to one, a plurality of, or all of the 16 bit streams at the nominal 2.5 GBPS rate. In a PRBS sensing operation, the PRBS function 1116 detects the existence of an incoming PRBS on one, a plurality of, or all of the 16 bit streams input to the input ordering (and deskew) block 1100. In a PRBS generation operation, the PRBS function 1116 produces a PRBS sequence on one, a plurality of, or all of the 16 bit streams output by the input ordering (and deskew) block 1100. Control of the PRBS function 1106 is performed via a PRBS control signal. The PRBS function 1116 also produces a PRBS test indication signal to indicate the status of the PRBS function 1116, e.g., good PRBS sequence detected, bad PRBS sequence detected, etc.

The output ordering block 1102 may also include a PRBS function 1114. The PRBS function 1114 in its various embodiments is capable of coupling to one, a plurality of, or all of the 4 bit streams at the nominal 10 GBPS rate that are received by, or produced by the output ordering block 1102. In a PRBS sensing operation, the PRBS function 1114 detects the existence of an incoming PRBS on one, a plurality of, or all of the 4 bit streams input to the output ordering block 1102. In a PRBS generation operation, the PRBS function 1114 produces a PRBS sequence on one, a plurality of, or all of the 4 bit streams output by the output ordering block 1102.

The output ordering block 1102 also includes a skew adder 1112 that operates based upon a skew control signal to add skew to one or more of the 4 bit streams output by the output ordering block 1102. As will be described further with reference to FIG. 14, the skew adder 1112 is used during testing of the RX data demultiplexing integrated circuit 306 to test its ability to deskew the data lines of the 4 bit stream interface.

The first TX data multiplexing integrated circuit 302 also includes loop back circuitry that allows one of the 16 outputs of the input ordering (and deskew) block 1100 to be looped out. The loop back circuitry includes a loop back multiplexer 1118 that receives as its inputs the 16 outputs of the input ordering (and deskew) block 1100 and produces a bit stream output based upon a loop back control input. As will be described further with reference to FIGS. 15 and 16, the loop back circuitry of the first TX data multiplexing integrated circuit 302 is employed in cooperation with loop back circuitry of the first RX data demultiplexing integrated circuit 306 to jointly test functionality of the integrated circuits.

Figure 11B:
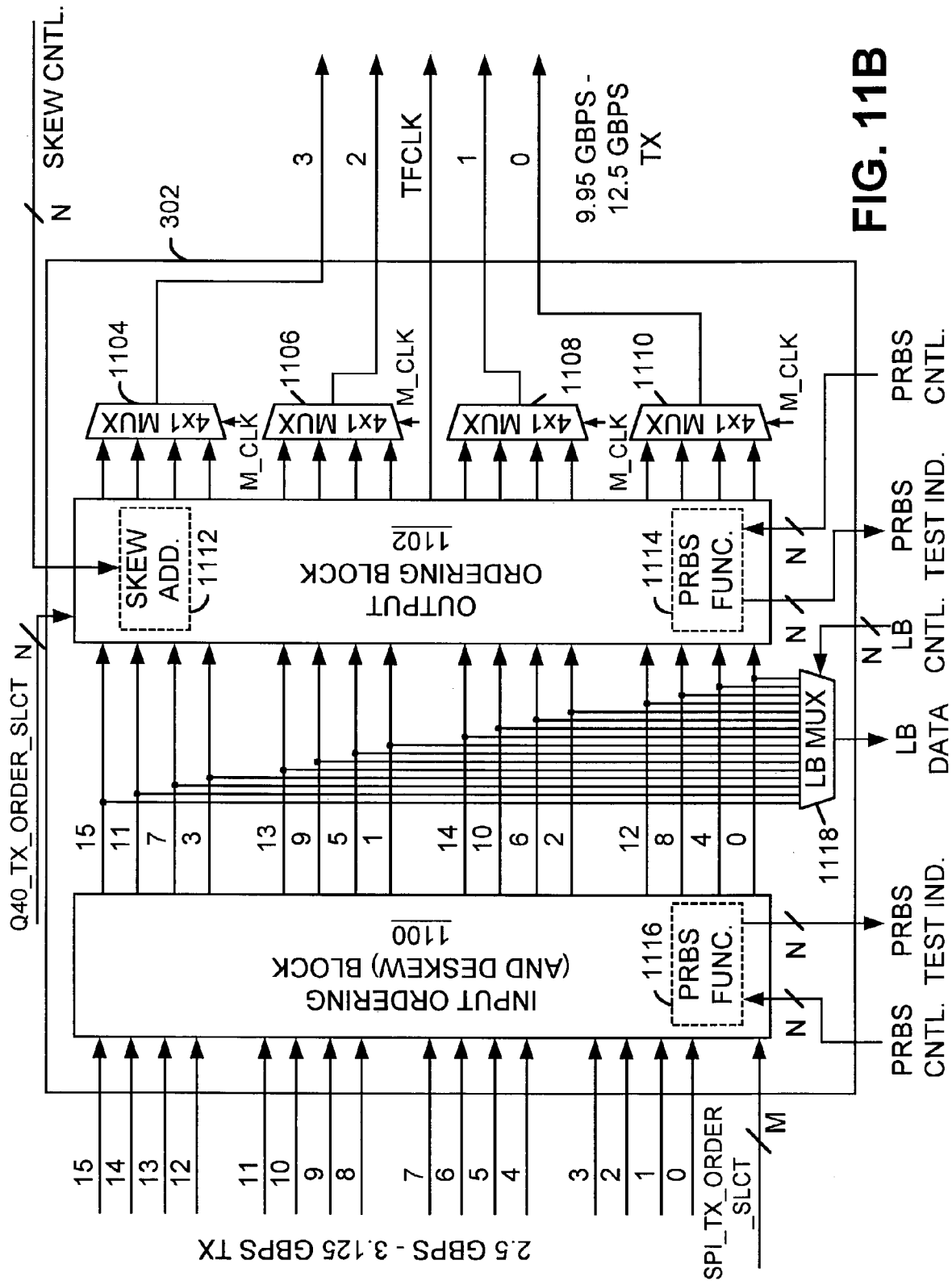

FIG. 11B is a block diagram illustrating a second embodiment of one aspect of the first TX data multiplexing integrated circuit 302 of FIG. 3. As contrasted to the structure of FIG. 11A, the embodiment of the TX data multiplexing integrated circuit 302 of FIG. 11B includes the output ordering block directly coupled to receive the output of the input ordering (and deskew) block 1100. Also, the multiplexers 1104, 1106, 1108, and 1110 receive the 16 bit stream outputs from the output ordering block 1102.

Thus, the TX data multiplexing integrated circuit 302 receives 16 bit streams at a nominal bit rate of 2.5 GBPS. The input ordering (and deskew) block 1100 orders and deskews these incoming bit streams based upon the m bit wide SPI_TX_ORDER_SELECT signal. The output of the input ordering (and deskew) block 1100 is received by the output ordering block 1102, which orders the sixteen data streams based upon the n bit wide Q40_TX_ORDER_SELECT signal. The output of the output ordering block 1102 is received by the plurality of TX 4×1 multiplexers 1104, 1106, 1108, and 1110 and, based upon the M_CLK signal, multiplexes the sixteen bit streams to produce a four bit stream output as shown.

In one embodiment/operation of the first TX data multiplexer circuit 302 of FIGS. 11A and 11B, the input ordering (and deskew) block 1100 is capable of reordering the outside input lines 12:15 and 0:3 via a positional exchange. Further, the input ordering (and deskew) block 1100 may reorder the inside inputs 8:11 and 4:7 via a positional exchange. Moreover, the input ordering (and deskew) block 1100 may reorder both the outside input lines 12:15 and 0:3 and the inside inputs 8:11 and 4:7 via a positional exchange. Additionally, in some embodiments, the input ordering (and deskew) block 1100 is controllable to invert the polarity of the (differential) inputs, reposition the inputs individually, and/or to reposition the inputs en masse. Output ordering block 1102 may invert the ordering of the outputs 0:4 to be their mirror image and/or may invert the polarity of the outputs 0:4 to accommodate flip-chip and wire bond mounting based on one or more states of the n bit Q40_TX_ORDER_SELECT signal. Further, the output ordering block 1102 may reposition the outputs individually or en masse.

FIG. 12A is a block diagram illustrating a first embodiment of the first RX data demultiplexing integrated circuit of FIG. 8A with particular detail relating to BIST structures contained therein. The first RX data multiplexing integrated circuit 306 receives four bit streams and the QCLKI of a multiple bit stream interface. An input ordering and deskew block 1202 deskews and orders the incoming bit streams. Ordering/reordering of the four input streams is based upon the n bit Q40_RX_ORDER_SELECT signal received by the input ordering and deskew block 1202. The input ordering and deskew block 1202 may also invert the polarity of the incoming bit streams based upon the Q40_RX_ORDER_SELECT signal. RX 1×4 demultiplexers 1204, 1206, 1208, and 1210 then demultiplex these signals based upon a DMCK signal. The 1×4 demultiplexers 1204, 1206, 1208, and 1210 produce 16 bit streams to output ordering block 1200. The output ordering block 1200 receives the 16 bit streams and orders/reorders the 16 bit streams based upon the m bit SPI_RX_ORDER_SELECT signal to produce 16 bit streams at a nominal bit rate of 2.5 GBPS to a coupled communication ASIC. The output ordering block 1200 also produces the 16 bit streams with a selected polarity based upon the m bit SPI_RX_ORDER_SELECT signal FIG. 12B is a block diagram illustrating a second embodiment of the first RX data demultiplexing integrated circuit of FIG. 8A with particular detail relating to BIST structures contained therein. The first RX data multiplexing integrated circuit 306 receives four bit streams and the QCLKI of a multiple bit stream interface from the second RX data multiplexing integrated circuit 308. A plurality of RX 4×1 demultiplexers 1204, 1206, 1208, and 1210 demultiplex the four bit streams based upon a DMCK to produce 16 bit streams to output ordering block 1200. Input ordering and deskew block 1202 receives the outputs from the multiplexers 1204, 1206, 1208, and 1210, deskews, and optionally orders/reorders (and optionally inverts the polarity of) these incoming bit streams based upon the Q40_RX_ORDER_SELECT signal. The output of the input ordering and deskew block 1202 is received by output ordering block 1200 that optionally orders/reorders the 16 bit streams based upon the m bit SPI_RX_ORDER_SELECT signal to produce 16 bit streams at a nominal bit rate of 2.5. In the demultiplexing integrated circuit 306 of both FIGS. 12A and 12B, the data may be presented in a natural order.

The first RX data demultiplexing integrated circuit 306 of FIGS. 12A and 12B include particular detail relating to BIST structures contained therein. In particular, the input ordering and deskew block 1202 of the RX data demultiplexing integrated circuit 306 includes a PRBS function 1212. The PRBS function 1212 in its various embodiments is capable of coupling to one, a plurality of, or all of the 4 bit streams at the nominal 10 GBPS rate (or to any of the 16 bit streams output by the input ordering and deskew block 1202 at 2.5 GBPS). In a PRBS sensing operation, the PRBS function 1212 detects the existence of an incoming PRBS on one, a plurality of, or all of the bit streams input to the input ordering and deskew block 1202. In a PRBS generation operation, the PRBS function 1212 produces a PRBS sequence on one, a plurality of, or all of the 4 (or 16) bit streams output by the input ordering and deskew block 1202. Control of the PRBS function 1212 is performed via a PRBS control signal. The PRBS function 1212 also produces a PRBS test indication signal to indicate the status of the PRBS function 1212, e.g., good PRBS sequence detected, bad PRBS sequence detected, etc.

The output ordering block 1200 may also include a PRBS function 1214. The PRBS function 1214 in its various embodiments is capable of coupling to one, a plurality of, or all of the 16 bit streams at the nominal 2.5 GBPS rate that are received by, or produced by the output ordering block 1200. In a PRBS sensing operation, the PRBS function 1214 detects the existence of an incoming PRBS on one, a plurality of, or all of the 16 bit streams input to the output ordering block 1202. In a PRBS generation operation, the PRBS function 1214 produces a PRBS sequence on one, a plurality of, or all of the 16 bit streams output by the output ordering block 1200.

The output ordering block 1200 also includes a skew adder 1216 that operates based upon a skew control signal to add skew to one or more of the 16 bit streams output by the output ordering block 1200. As will be described further with reference to FIG. 13, the skew adder 1216 is used during testing of the TX data multiplexing integrated circuit 302 to test its ability to deskew the data lines of the 16 bit stream interface.

The first RX data demultiplexing integrated circuit 306 also includes loop back circuitry that allows a bit stream to be selectively input as one (or more over time) of the 16 inputs to the output ordering block 1200. The loop back circuitry includes a loop back demultiplexer 1218 that receives as its input the bit stream and produces as its output the bit stream to one of the 16 inputs of the output ordering block 1200 based upon a loop back control input. As will be described further with reference to FIGS. 15 and 16, the loop back circuitry of the first RX data demultiplexing integrated circuit 306 is employed in cooperation with loop back circuitry of the first TX data multiplexing integrated circuit 302 to jointly test the functionality of each.

FIG. 13 is a block diagram illustrating the first TX data multiplexing integrated circuit 302 and the first RX data demultiplexing integrated circuit 306 having their respective 16 bit 2.5 GBPS link interfaces tested within a circuit tester 1302. As shown, the circuit tester 1302 includes a tester control block 1304 and a user interface 1306 that allows a user to program the operation of the circuit tester 1302.

In the testing operation shown in FIG. 13, the RX data demultiplexing integrated circuit 306 has its PRBS function 1212 (or 1214) controlled via a PRBS control signal by the tester control block 1304. Based upon the PRBS control signal, the PRBS function 1212 (or 1214) produces a PRBS that is output on the 16 bit 2.5 GBPS link to the first TX data multiplexing integrated circuit 302. The PRBS function 1116 (or 1114) of the first TX data multiplexing integrated circuit 302 receives the PRBS and determines whether the PRBS has been received correctly. The PRBS function 1116 (or 1114) of the first TX data multiplexing integrated circuit 302 produces a PRBS test indication signal to the tester control block 1304 to indicate whether the PRBS has been correctly received. By using the PRBS function 1212 (or 1214) and the PRBS function 1116 (or 1114), the functionality of each of the components of the first TX data multiplexing integrated circuit 302 and the RX data demultiplexing integrated circuit 306 that support the 16 bit 2.5 GBPS link may be tested.

Additionally, the skew adder 1216 may be controlled by the tester control block 1304 to selectively add skew to each of the 16 bit streams of the 2.5 GBPS link. By adding skew to these bit streams, the ability of the first TX data multiplexing integrated circuit 302 to remove skew from the 16 bit streams of the 2.5 GBPS link is tested. The skew adder 1216 may be controlled to add skew during the PRBS testing.

FIG. 16 illustrates one group of operations according to the present invention are described that may be performed using the structure of FIG. 13. Operation commences with the coupling of the RX data demultiplexing integrated circuit 306 and the TX data multiplexing integrated circuit 302 into the circuit tester 1302 (step 1602). In this operation, the 16 bit wide interfaces of the RX data demultiplexing integrated circuit 306 and the TX data multiplexing integrated circuit 302 are coupled. Then, the circuit tester, the RX data demultiplexing integrated circuit 306, and the TX data multiplexing integrated circuit 302 are powered and initialized (step 1604).

Next, SPI_order select operations are determined (step 1606) and the SPI_RX_ORDER_SELECT and the SPI_TX_ORDER_SELECT signals are set accordingly (step 1608). The PRBS functions 1212 (1214) and 1116 (1114) in the RX data demultiplexing integrated circuit 306 and the TX data multiplexing integrated circuit 302, respectively, are next initialized (step 1610). Then, the skew adder 1216 is optionally controlled to add skew (step 1612). Then, the PRBS operations commence (step 1614) and during the PRBS operations the PRBS function 1116 (1114) of the TX data multiplexing integrated circuit 302 determines whether the operation has failed (step 1616). If so, the PRBS function 1116 (1114) notifies the tester control block 1304 of the failure and the circuit tester 1302 generates a failure report (step 1620).

If no failure is detected (step 1616) and the testing is not done (step 1618), operation returns to step 1606 where additional operations are performed. Generally, testing is performed for some, most, or all SPI_RX_ORDER_SELECT and the SPI_TX_ORDER_SELECT settings. Further, for each of these SPI_RX_ORDER_SELECT and the SPI_TX_ORDER_SELECT settings, differing levels of skew may be tested to determine that the TX data multiplexing integrated circuit 302 may meet its required specifications. When all operations have been completed, as determined at step 1618, operation is completed.

FIG. 14 is a block diagram illustrating the first TX data multiplexing integrated circuit and the first RX data demultiplexing integrated circuit having their respective 4 bit 10 GBPS links tested within a circuit tester 1402. In the testing operation shown in FIG. 25, the TX data multiplexing integrated circuit 302 has its PRBS function 1114 (or 1116) controlled via a PRBS control signal by the tester control block 1304. Based upon the PRBS control signal, the PRBS function 1114 (or 1116) produces a PRBS that is output on the 4 bit 10 GBPS link to the first RX data demultiplexing integrated circuit 306. The PRBS function 1214 (or 1216) of the first RX data demultiplexing integrated circuit 306 receives the PRBS and determines whether the PRBS has been received correctly. The PRBS function 1214 (or 1216) of the first RX data demultiplexing integrated circuit 306 produces a PRBS test indication signal to the tester control block 1304 to indicate whether the PRBS has been correctly received. By using the PRBS function 1114 (or 1116) and the PRBS function 1214 (or 1216), the functionality of each of the signal paths corresponding to the 4 bit 10 GBPS link of the TX data multiplexing integrated circuit 302 and the RX data demultiplexing integrated circuit 306 may be tested.

Additionally, the skew adder 1112 may be controlled by the tester control block 1304 to selectively add skew to each of the 4 bit streams of the 10 GBPS link. By adding skew to these bit streams, the ability of the first RX data demultiplexing integrated circuit 306 to remove skew from the 4 bit streams of the 10 GBPS link is tested. The skew adder 1112 may be controlled to add skew during the PRBS testing.

FIG. 17 illustrates one group of operations according to the present invention are described that may be performed using the structure of FIG. 14. Operation commences with the coupling of the TX data multiplexing integrated circuit 302 and the RX data demultiplexing integrated circuit 306 into the circuit tester 1402 (step 1702). In this operation, the 4 bit wide interfaces of the TX data multiplexing integrated circuit 302 and the RX data demultiplexing integrated circuit 306 are coupled. Then, the circuit tester 1402, the TX data multiplexing integrated circuit 302, and the RX data demultiplexing integrated circuit 306 are powered and initialized (step 1704).

Next, Q40 order select operations are determined (step 1706) and the Q40TX_ORDER_SELECT and the Q40_RX_ORDER_SELECT signals are set accordingly (step 1708). The PRBS functions 1114 (1116) and 1214 (1216) in the TX data multiplexing integrated circuit 302 and the RX data demultiplexing integrated circuit 306, respectively, are next initialized (step 1610). Then, the skew adder 1112 is optionally controlled to add skew (step 1712). Then, the PRBS operations commence (step 1714) and during the PRBS operations the PRBS function 1214 (1216) of the RX data demultiplexing integrated circuit 306 determines whether the operation has failed (step 1716). If so, the PRBS function 1214 (1216) notifies the tester control block 1404 of the failure and the circuit tester 1402 generates a failure report (step 1720).

If no failure is detected (step 1716) and the testing is not done (step 1718), operation returns to step 1706 where additional operations are performed. Generally, testing is performed for some, most, or all Q40_TX_ORDER_SELECT and the Q40_RX_ORDER_SELECT settings. Further, for each of these Q40_TX_ORDER_SELECT and the Q40_RX_ORDER_SELECT settings, differing levels of skew may be tested to determine that the RX data demultiplexing integrated circuit 306 meets its required specifications, e.g., the specifications of FIGS. 8A and 8B. When all operations have been completed, as determined at step 1718, operation is completed.

FIG. 15 is a block diagram illustrating the first TX data multiplexing integrated circuit 302 and the first RX data demultiplexing integrated circuit 306 having their respective 16 bit 2.5 GBPS links tested within a circuit tester 1502 using built in loop back testing structures. As is shown, the tester control block 1504 provides a 16 bit 2.5 GBPS loop back data input to the first TX data multiplexing integrated circuit 302 via the input ordering (and deskew) block 1100. The tester control block 1504 controls the operation of the loop back multiplexer 1118 to loop back one of the 16 streams of data output by the input ordering (and deskew) block 1100. The tester control block 1504 also controls the input ordering (and deskew) block 1100 via the SPI_RX_ORDER_SELECT signal.

The looped back stream of data output by the loop back multiplexer 1118 is received by the loop back demultiplexer 1218 of the RX data demultiplexer circuit 306. The loop back demultiplexer 1218 of the RX data demultiplexing integrated circuit 306 is controlled by the tester control block 1504 via the loop back control signal. The loop back demultiplexer 1218 demultiplexes the looped back stream of data to produce a plurality of bit streams to the output ordering block 1200 of the RX data demultiplexing integrated circuit 306. The output ordering block 1200 of the first RX data demultiplexing integrated circuit 306 orders the plurality of bit streams based upon the SPI_RX_ORDER_SELECT signal provided by the tester control block 1504 and provides its 16 bit 2.5 GBPS output to the tester control block 1504. The tester control block 1504 determines if the data is received correctly. By controlling the loop back control signals provided to the TX data multiplexing integrated circuit 302 and the RX data demultiplexing integrated circuit 306, the circuit tester 1502 can test input ordering (and deskew) block 1100 of the first TX data multiplexing integrated circuit 302 and the output ordering block 1200 of the first RX data demultiplexing integrated circuit 306.

FIG. 18 illustrates one group of operations according to the present invention are described that may be performed using the structure of FIG. 15. Operation commences with the coupling of the TX data multiplexing integrated circuit 302 and the RX data demultiplexing integrated circuit 306 into the circuit tester 1402 (step 1802). In this operation, the 16 bit wide interfaces of the TX data multiplexing integrated circuit 302 and the RX data demultiplexing integrated circuit 306 are coupled. Then, the circuit tester 1502, the TX data multiplexing integrated circuit 302, and the RX data demultiplexing integrated circuit 306 are powered and initialized (step 1804).

Next, SPI order select operations are determined and the SPI_TX_ORDER_SELECT and the SPI_RX_ORDER_SELECT signals are set accordingly (step 1806). Then, the tester control block 1504 sets the TX loop back multiplexer 1118 and the RX loop back multiplexer 1218 for the particular operation (step 1808). Then, the tester control block 1404 optionally adds skew to a plurality of bit streams that are to be input (step 1810). Then, one or more bit streams are transmitted to the TX data multiplexing integrated circuit 302 (step 1812) by the tester control block 1504 and are received from the RX data demultiplexing integrated circuit 306 by the tester control block 1504 (step 1814). Based upon the bit stream received, the tester control block determines whether the operation has failed (step 1816). If so, the tester control block 1504 generates a failure report (step 1820).

If no failure is detected (step 1816) and the testing is not done (step 1818), operation returns to step 1806 where additional operations are performed. Generally, testing is performed for some, most, or all SPI_TX_ORDER_SELECT and the SPI_RX_ORDER_SELECT settings. Further, for each of these SPI_TX_ORDER_SELECT and the SPI_RX_ ORDER_SELECT settings, differing levels of skew may be tested to determine that the TX data multiplexing integrated circuit 302 meets its required specifications. When all operations have been completed, as determined at step 1818, operation is completed.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A bit stream multiplexer integrated circuit comprising:
a plurality of multiplexers and an input ordering block that operate in cooperation to receive a first plurality of differential transmit bit streams at a first bit rate, to order the first plurality of differential transmit bit streams based upon a first order select signal, and to produce an interface plurality differential transmit bit streams at an interface bit rate;
an output ordering block that operates to order the interface plurality of transmit bit streams and to produce each of the interface plurality of differential transmit bit streams with a inverted polarity based upon an interface order select signal; and
a Pseudo Random Bit Stream (PRBS) function that produces a PRBS that is coupled to at least one of the interface plurality of differential transmit bit streams.

2. The bit stream multiplexer integrated circuit of claim 1, wherein:
the first plurality of differential transmit bit streams includes sixteen differential transmit bit streams; and
the interface plurality of differential transmit bit streams includes four differential transmit bit streams.

3. The bit stream multiplexer integrated circuit of claim 1, wherein the input ordering block further deskews the first plurality of differential transmit bit streams.

4. The bit stream multiplexer integrated circuit of claim 1, wherein the plurality of multiplexers couple to the output of the output ordering block.

5. The bit stream multiplexer integrated circuit of claim 1, wherein the plurality of multiplexers couple to the input of the output ordering block.

6. The bit stream multiplexer integrated circuit of claim 1, wherein the PRBS function produces the PRBS on a plurality of the interface plurality of differential transmit bit streams.

7. The bit stream multiplexer integrated circuit of claim 1, further comprising a skew adding circuit that adds skew to at least one of the interface plurality of differential transmit bit streams.

8. The bit stream multiplexer integrated circuit of claim 1, wherein the PRBS function resides in the output ordering block.

9. The bit stream multiplexer integrated circuit of claim 1, wherein the PRBS function resides in the input ordering block.

10. The bit stream multiplexer integrated circuit of claim 1, wherein:
the first plurality of differential transmit bit streams includes sixteen differential transmit bit streams; the interface plurality of differential transmit bit streams includes four differential transmit bit streams; and
the plurality of multiplexers includes four multiplexers having four inputs and one output each.

11. A bit stream demultiplexer integrated circuit comprising:
a plurality of demultiplexers and an input ordering block that operate in cooperation to receive an interface plurality of differential receive bit streams at an interface bit rate, to order the interface plurality of receive bit streams of differential receive bit streams, and to demultiplex the interface plurality of differential receive bit streams to produce a first plurality of receive bit streams of differential receive bit streams at a first bit rate;
an output ordering block that receives the first plurality of differential receive bit streams at the first bit rate and that orders the first plurality of differential receive bit streams with a selected polarity based upon a first order select signal; and
a Pseudo Random Bit Stream (PRBS) function that produces a PRBS that is coupled to at least one of the first plurality of receive bit streams of differential receive bit streams.

12. A bit stream demultiplexer integrated circuit of claim 11, wherein:
the first plurality of differential receive bit streams includes sixteen differential receive bit streams; and
the interface plurality of differential receive bit streams includes four differential receive bit streams 13. A bit stream demultiplexer integrated circuit of claim 11, wherein: the first bit rate is nominally 2.5 Giga Bits per Second (GBPS); and the interface bit rate is nominally 10 GBPS.

14. A bit stream demultiplexer integrated circuit of claim 11, wherein the plurality of demultiplexers provides input to the input ordering block.

15. A bit stream demultiplexer integrated circuit of claim 11, wherein the input ordering block provides input to the plurality of demultiplexers.

16. A bit stream demultiplexer integrated circuit of claim 11, further comprising a skew adding circuit that adds skew to the PRBS that is coupled to at least one of the first plurality of differential receive bit streams.

17. A bit stream demultiplexer integrated circuit of claim 11, wherein the PRBS function resides in the output ordering block.

18. A bit stream demultiplexer integrated circuit of claim 11, wherein the PRBS function resides in the input ordering block.

19. A bit stream demultiplexer integrated circuit of claim 11, wherein the input ordering block further deskews the first plurality of differential receive bit streams.

20. A bit stream demultiplexer integrated circuit of claim 11, wherein:
the first plurality of differential receive bit streams includes sixteen differential receive bit streams;
the interface plurality of differential receive bit streams includes four differential receive bit streams; and
the plurality of demultiplexers includes four demultiplexers having one input and four outputs each.

21. A method for testing the functionality of a transmit multiplexing integrated circuit and a receive demultiplexing integrated circuit, the method comprising:
coupling the receive demultiplexing integrated circuit and the transmit multiplexing integrated circuit into a circuit tester;
coupling a plurality of differential output lines of the receive demultiplexing integrated circuit to a plurality of differential input lines of the transmit multiplexing integrated circuit;
selecting the polarity of the plurality of differential output lines of the receive multiplexing integrated circuit and the plurality of differential input lines of the transmit demultiplexing integrated circuit, wherein the selected polarity includes at least one of a first polarity and a second polarity:
generating a Pseudo Random Bit Stream (PRBS) within the receive demultiplexing integrated circuit;
coupling the PRBS to at least one differential output line of the receive demultiplexing integrated circuit;
receiving the PRBS on at least one differential input line of the transmit multiplexing integrated circuit;

determining whether the PRBS is correctly received by the transmit multiplexing integrated circuit;

when the PRBS is correctly received by the transmit multiplexing integrated circuit, providing a pass indication to the circuit tester; and when the PRBS is incorrectly received by the transmit multiplexing integrated circuit, providing a fail indication to the circuit tester.

22. The method of claim 21, further comprising adding skew to the PRBS generated in the receive demultiplexing integrated circuit.

23. The method of claim 21, wherein the plurality of differential output lines of the receive demultiplexing integrated circuit include sixteen lines and the PRBS is coupled over time to each of the sixteen lines.

24. The method of claim 21, further comprising controlling the plurality of differential output lines of the receive demultiplexing integrated circuit and the plurality of differential input lines of the transmit multiplexing integrated circuit to alter the line carrying the PRBS.

25. A method for testing the functionality of a transmit multiplexing integrated circuit and a receive demultiplexing integrated circuit, the method comprising:

coupling the transmit multiplexing integrated circuit and the receive demultiplexing integrated circuit into a circuit tester;

coupling a plurality of differential output lines of the transmit multiplexing integrated circuit to a plurality of differential input lines of the receive demultiplexing integrated circuit;

selecting the polarity of the plurality of differential output lines of the transmit multiplexing integrated circuit and the plurality of differential input lines of the receive demultiplexing integrated circuit, wherein the selected polarity includes at least one of a first polarity and a second polarity:

generating a Pseudo Random Bit Stream (PRBS) within the transmit multiplexing integrated circuit;

coupling the PRBS to at least one differential output line of the transmit multiplexing integrated circuit;

receiving the PRBS on at least one differential input line of the receive demultiplexing integrated circuit;

determining whether the PRBS is correctly received by the receive demultiplexing integrated circuit;

when the PRBS is correctly received by the receive demultiplexing integrated circuit, providing a pass indication to the circuit tester; and when the PRBS is incorrectly received by the receive demultiplexing integrated circuit, providing a fail indication to the circuit tester.

26. The method of claim 25, further comprising adding skew to the PRBS generated in the transmit multiplexing integrated circuit.

27. The method of claim 25, wherein the plurality of output lines the plurality of differential output lines of the transmit multiplexing integrated circuit includes four lines and the PRBS is coupled over time to each of the four lines.

28. The method of claim 25, further comprising controlling the plurality of differential output lines of the transmit multiplexing integrated circuit and the plurality of differential input lines of the receive demultiplexing integrated circuit to alter the line carrying the PRB S.

* * * * *

UNITED STATES PATENT AND TRADEMARK OFFICE
CERTIFICATE OF CORRECTION

| | |
|---|---|
| PATENT NO. | : 7,672,340 B2 |
| APPLICATION NO. | : 10/349560 |
| DATED | : March 2, 2010 |
| INVENTOR(S) | : Daniel Schoch et al. |

It is certified that error appears in the above-identified patent and that said Letters Patent is hereby corrected as shown below:

Column 5, line 47: replace "FIG. 11A" with --FIG. 11B--.

Claim 11, Column 18, line 6: remove "of receive bit streams".

Claim 12, Column 18, line 13: replace "streams" with --streams.--.

Signed and Sealed this

Fourth Day of May, 2010

David J. Kappos
*Director of the United States Patent and Trademark Office*